(12) United States Patent
Chung et al.

(10) Patent No.: US 12,342,613 B2
(45) Date of Patent: Jun. 24, 2025

(54) LOW LEAKAGE DEVICE

(71) Applicant: Taiwan Semiconductor Manufacturing Co., Ltd., Hsin-Chu (TW)

(72) Inventors: Cheng-Ting Chung, Hsinchu (TW); Ching-Wei Tsai, Hsinchu (TW); Kuan-Lun Cheng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 91 days.

(21) Appl. No.: 17/859,638

(22) Filed: Jul. 7, 2022

(65) Prior Publication Data

US 2022/0336461 A1 Oct. 20, 2022

Related U.S. Application Data

(62) Division of application No. 16/802,311, filed on Feb. 26, 2020, now Pat. No. 11,404,417.

(51) Int. Cl.
*H10D 30/67* (2025.01)
*H01L 21/02* (2006.01)
(Continued)

(52) U.S. Cl.
CPC ....... *H10D 84/853* (2025.01); *H01L 21/0212* (2013.01); *H01L 21/30604* (2013.01); *H10D 30/6735* (2025.01); *H10D 62/021* (2025.01); *H10D 62/121* (2025.01); *H10D 62/151* (2025.01); *H10D 62/292* (2025.01);
(Continued)

(58) Field of Classification Search
CPC .......... H01L 21/0262; H01L 29/66553; H01L 29/78696; H01L 21/02576; H01L 29/6681
See application file for complete search history.

(56) References Cited

U.S. PATENT DOCUMENTS 9,601,569 B1 3/2017 Suk et al.
9,818,872 B2 11/2017 Ching et al.
(Continued)

FOREIGN PATENT DOCUMENTS

KR 20170067117 A 6/2017
KR 20180035410 A 4/2018
(Continued)

*Primary Examiner* — Brian Turner
(74) *Attorney, Agent, or Firm* — HAYNES AND BOONE, LLP

(57) ABSTRACT

A semiconductor device according to the present disclosure includes a first plurality of gate-all-around (GAA) devices in a first device area and a second plurality of GAA devices in a second device area. Each of the first plurality of GAA devices includes a first vertical stack of channel members extending along a first direction, and a first gate structure over and around the first vertical stack of channel members. Each of the second plurality of GAA devices includes a second vertical stack of channel members extending along a second direction, and a second gate structure over and around the second vertical stack of channel members. Each of the first plurality of GAA devices includes a first channel length and each of the second plurality of GAA devices includes a second channel length smaller than the first channel length.

20 Claims, 24 Drawing Sheets

(51) Int. Cl.
*H01L 21/306* (2006.01)
*H10D 62/00* (2025.01)
*H10D 62/10* (2025.01)
*H10D 62/13* (2025.01)
*H10D 62/17* (2025.01)
*H10D 64/01* (2025.01)
*H10D 64/27* (2025.01)
*H10D 84/01* (2025.01)
*H10D 84/03* (2025.01)
*H10D 84/85* (2025.01)

(52) U.S. Cl.
CPC ......... *H10D 64/017* (2025.01); *H10D 64/021* (2025.01); *H10D 64/517* (2025.01); *H10D 84/0167* (2025.01); *H10D 84/017* (2025.01); *H10D 84/0172* (2025.01); *H10D 84/0193* (2025.01); *H10D 84/038* (2025.01); *H10D 84/856* (2025.01)

(56) References Cited

U.S. PATENT DOCUMENTS

| | | | |
|---|---|---|---|
| 9,887,269 | B2 | 2/2018 | Ching et al. |
| 9,899,398 | B1 | 2/2018 | Colinge et al. |
| 9,947,804 | B1 | 4/2018 | Frougier |
| 10,032,627 | B2 | 7/2018 | Lee et al. |
| 10,109,721 | B2 | 10/2018 | Lin et al. |
| 10,157,799 | B2 | 12/2018 | Ching et al. |
| 10,199,502 | B2 | 2/2019 | Huang et al. |
| 10,290,546 | B2 | 5/2019 | Chiang et al. |
| 10,475,902 | B2 | 11/2019 | Lee et al. |
| 2007/0196980 | A1* | 8/2007 | Subramanian ............ G03F 7/40 438/253 |
| 2014/0183642 | A1* | 7/2014 | Liang ............... H01L 21/823412 438/299 |
| 2017/0141112 | A1 | 5/2017 | Ching |
| 2017/0154958 | A1* | 6/2017 | Fung ................. H01L 29/42392 |
| 2017/0200728 | A1 | 7/2017 | Huang et al. |
| 2017/0243868 | A1* | 8/2017 | Lee ................. H01L 21/823821 |
| 2018/0082902 | A1* | 3/2018 | Balakrishnan ........ H01L 29/401 |
| 2018/0151438 | A1 | 5/2018 | Chiang et al. |
| 2018/0175035 | A1 | 6/2018 | Yang |
| 2018/0175036 | A1 | 6/2018 | Ching et al. |
| 2018/0197858 | A1* | 7/2018 | Clevenger ........... H01L 29/0649 |
| 2018/0294331 | A1 | 10/2018 | Cho |
| 2019/0088798 | A1* | 3/2019 | Kim ....................... B82Y 10/00 |
| 2019/0181140 | A1 | 6/2019 | Rodder et al. |
| 2019/0341450 | A1 | 11/2019 | Lee et al. |
| 2020/0006356 | A1 | 1/2020 | Ando et al. |
| 2020/0006478 | A1 | 1/2020 | Hsu et al. |
| 2020/0020688 | A1 | 1/2020 | Badaroglu |
| 2020/0035820 | A1 | 1/2020 | Zhang |
| 2020/0058503 | A1* | 2/2020 | Vidyarthi .......... H01L 21/02118 |
| 2020/0066725 | A1 | 2/2020 | Bhuwalka |
| 2020/0098915 | A1 | 3/2020 | Cheng |
| 2020/0350215 | A1 | 11/2020 | Zhang |
| 2020/0381305 | A1* | 12/2020 | Ando ............... H01L 21/823468 |

FOREIGN PATENT DOCUMENTS

| | | |
|---|---|---|
| KR | 20190024600 A | 3/2019 |
| KR | 20190024625 A | 3/2019 |
| KR | 102171135 B1 | 10/2020 |
| TW | 201820430 A | 6/2018 |
| TW | 201913822 A | 4/2019 |

\* cited by examiner

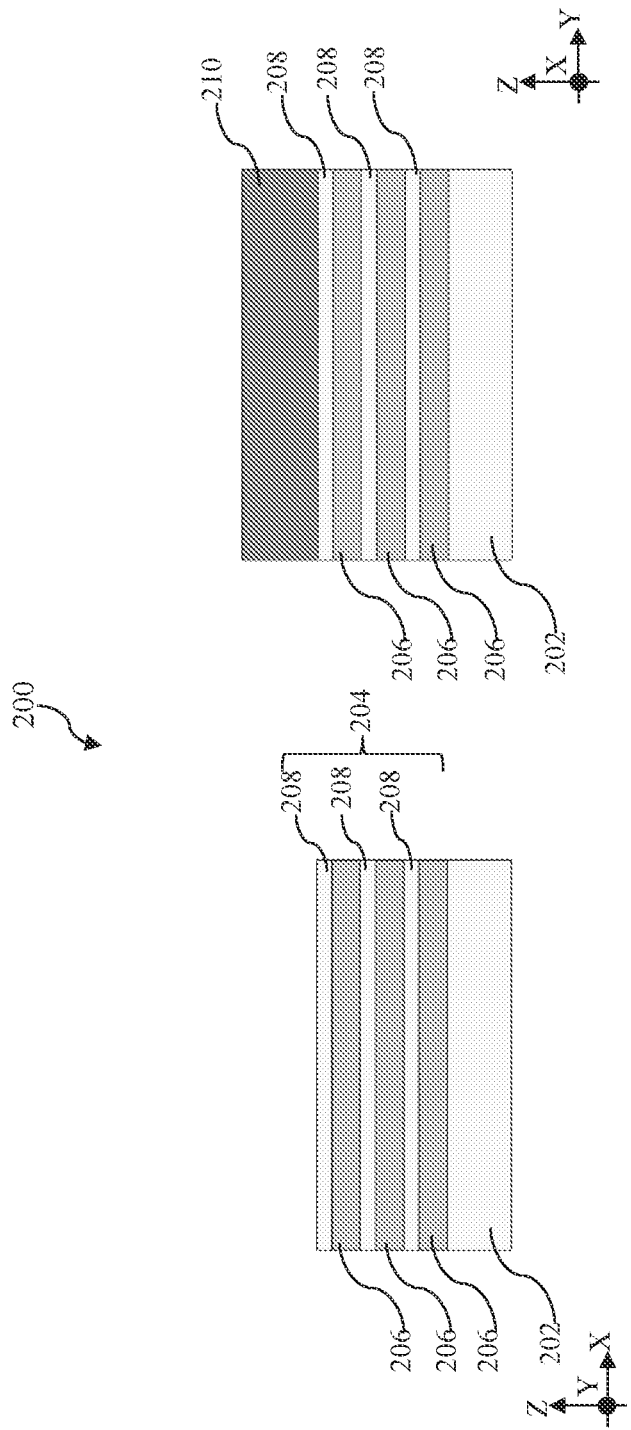

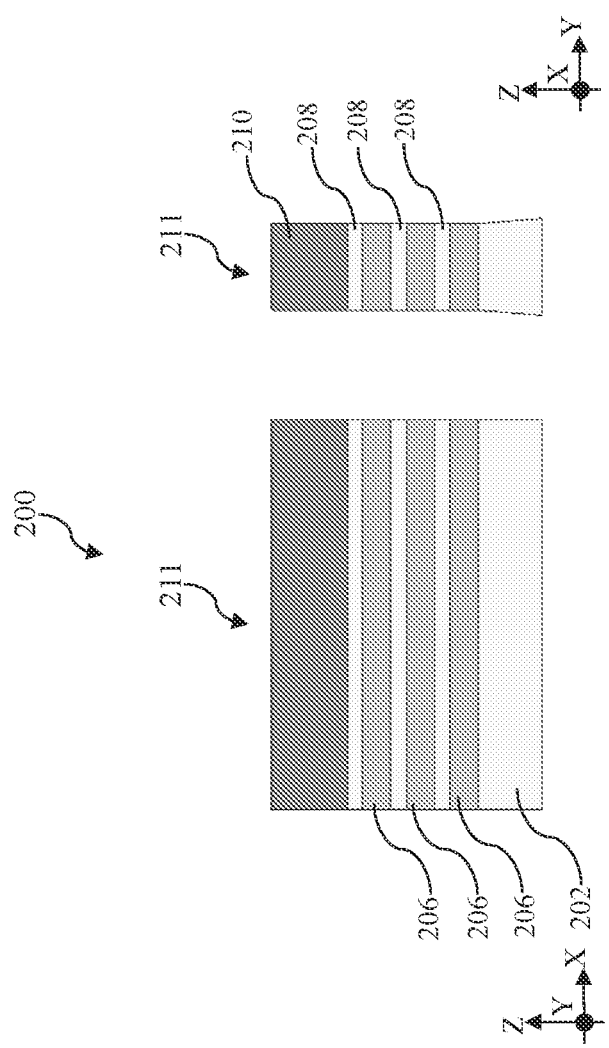

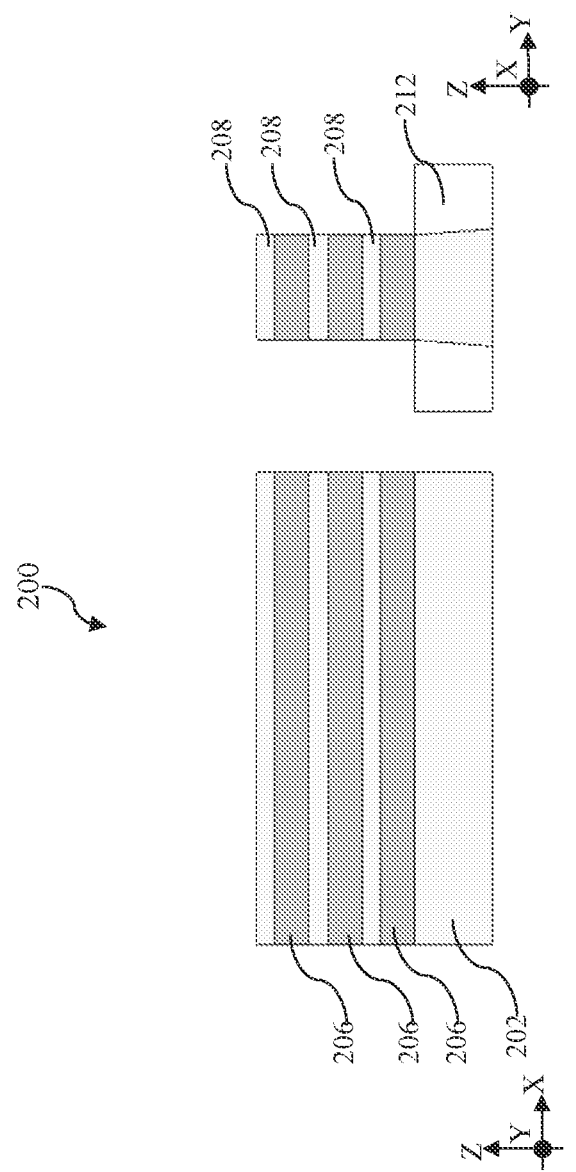

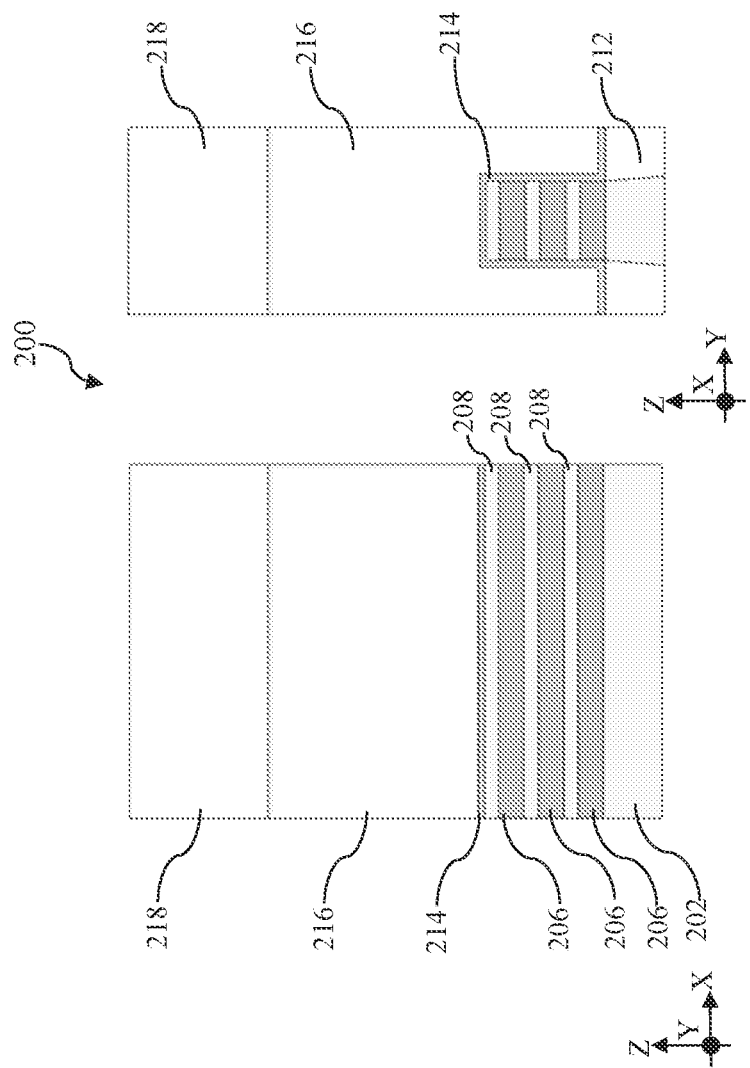

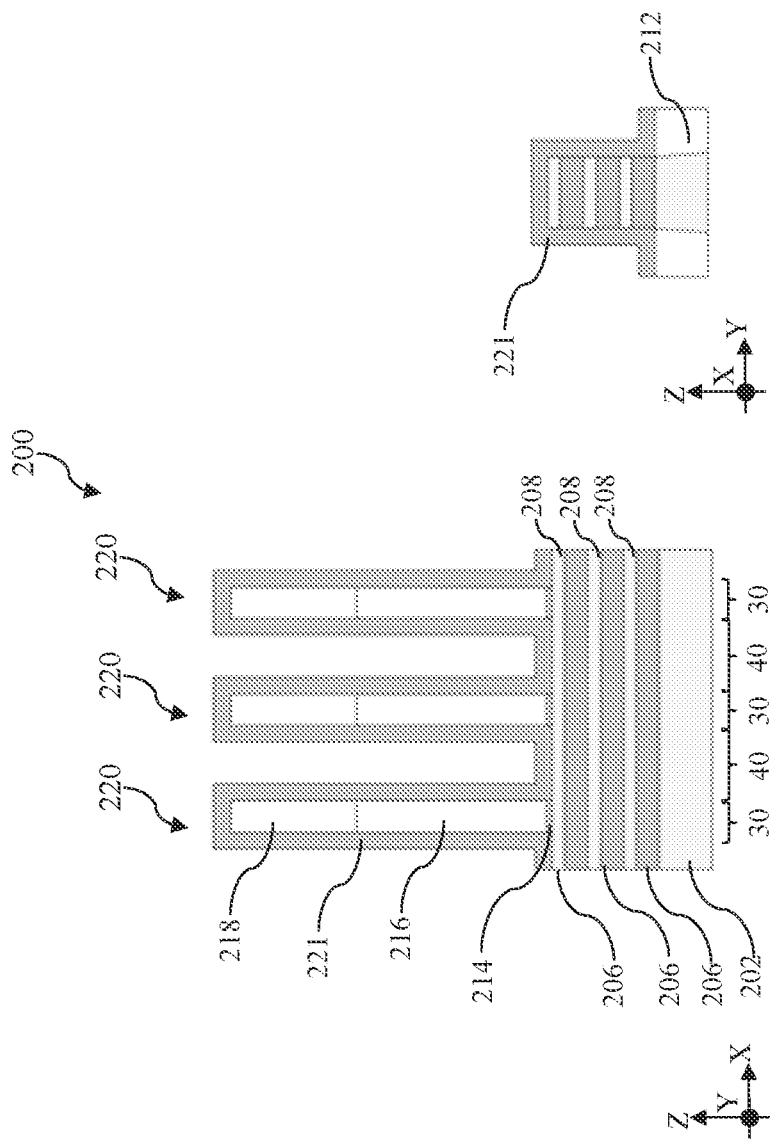

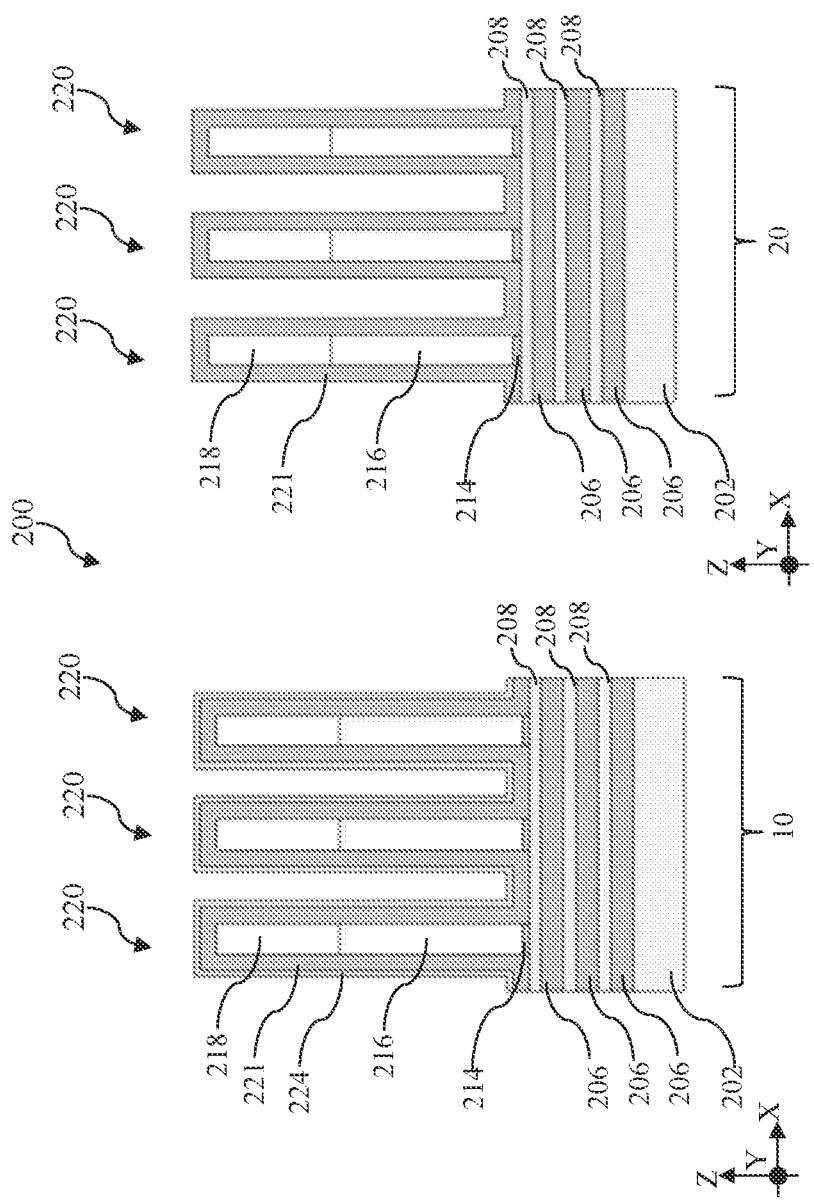

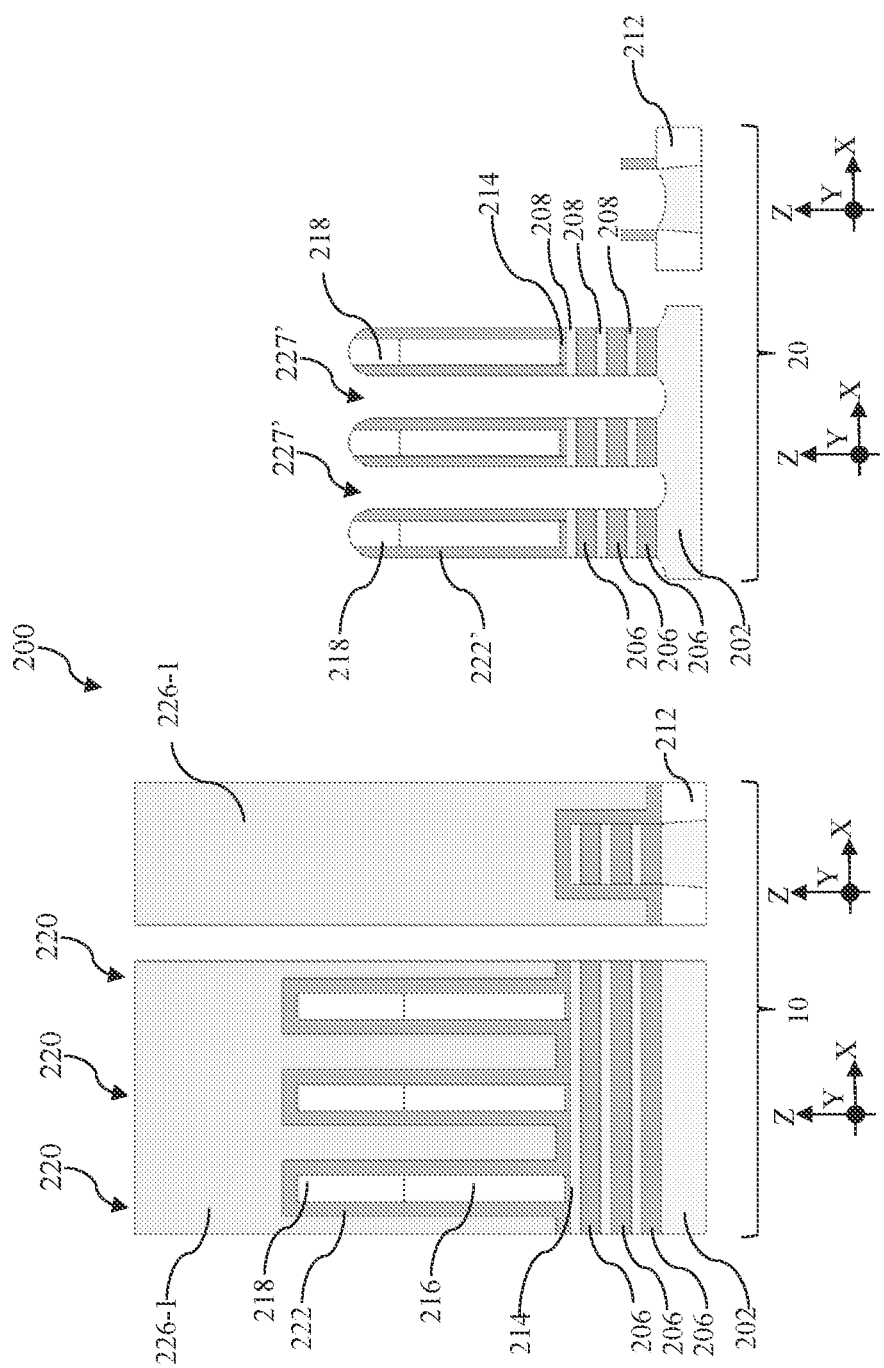

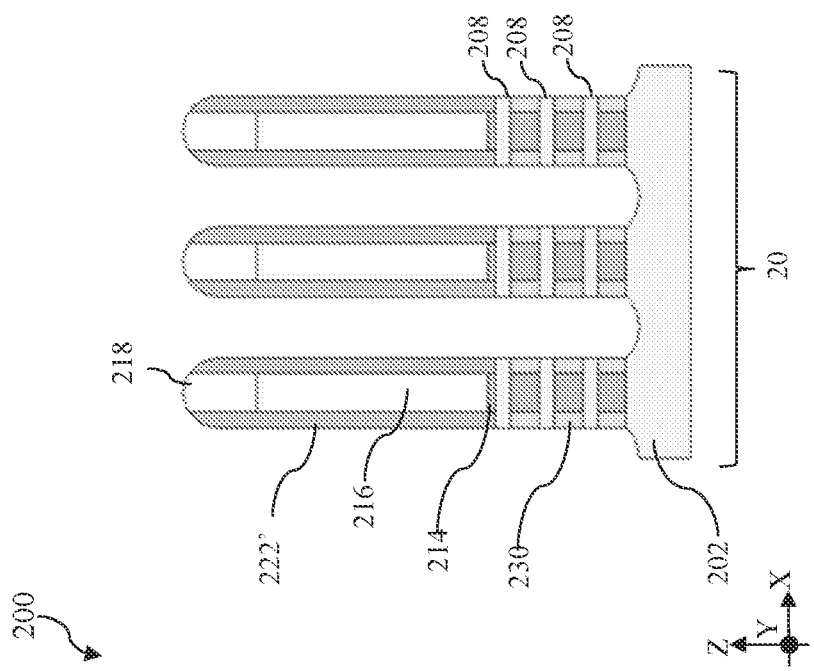
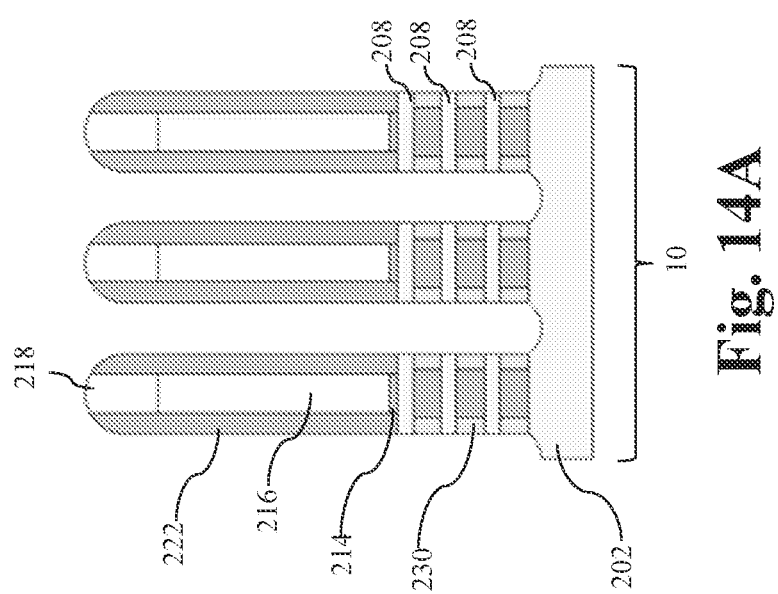

LOW LEAKAGE DEVICE

PRIORITY

This application is a divisional application of U.S. patent application Ser. No. 16/802,311, filed Feb. 26, 2020, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) that are vertically stacked. Such GAA transistor can be referred to as a vertically-stacked horizontal GAA (VGAA) transistor.

Different processes have been developed to achieve different GAA transistors with different threshold voltages in different device areas. The different voltages allow stage-wise activation of transistors in different device areas. It has been observed that these conventional processes may cause gate edge roughness and reduce process stability. Therefore, although conventional GAA devices have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4A-4B, 5A-5B, 6A-6B, 7A-7B, 8A-8B, 9A-9B, 10A-10B, 11A-11B, 12A-12B, 13A-13B, 14A-14B, 15, 16, 17, 18, 19, 20, 21, and 22A-22B illustrate cross-sectional views of a workpiece during a fabrication process according to the method of FIGS. 1A-1C, according to one or more aspects of the present disclosure.

DETAILED DESCRIPTION

Figure 1A:
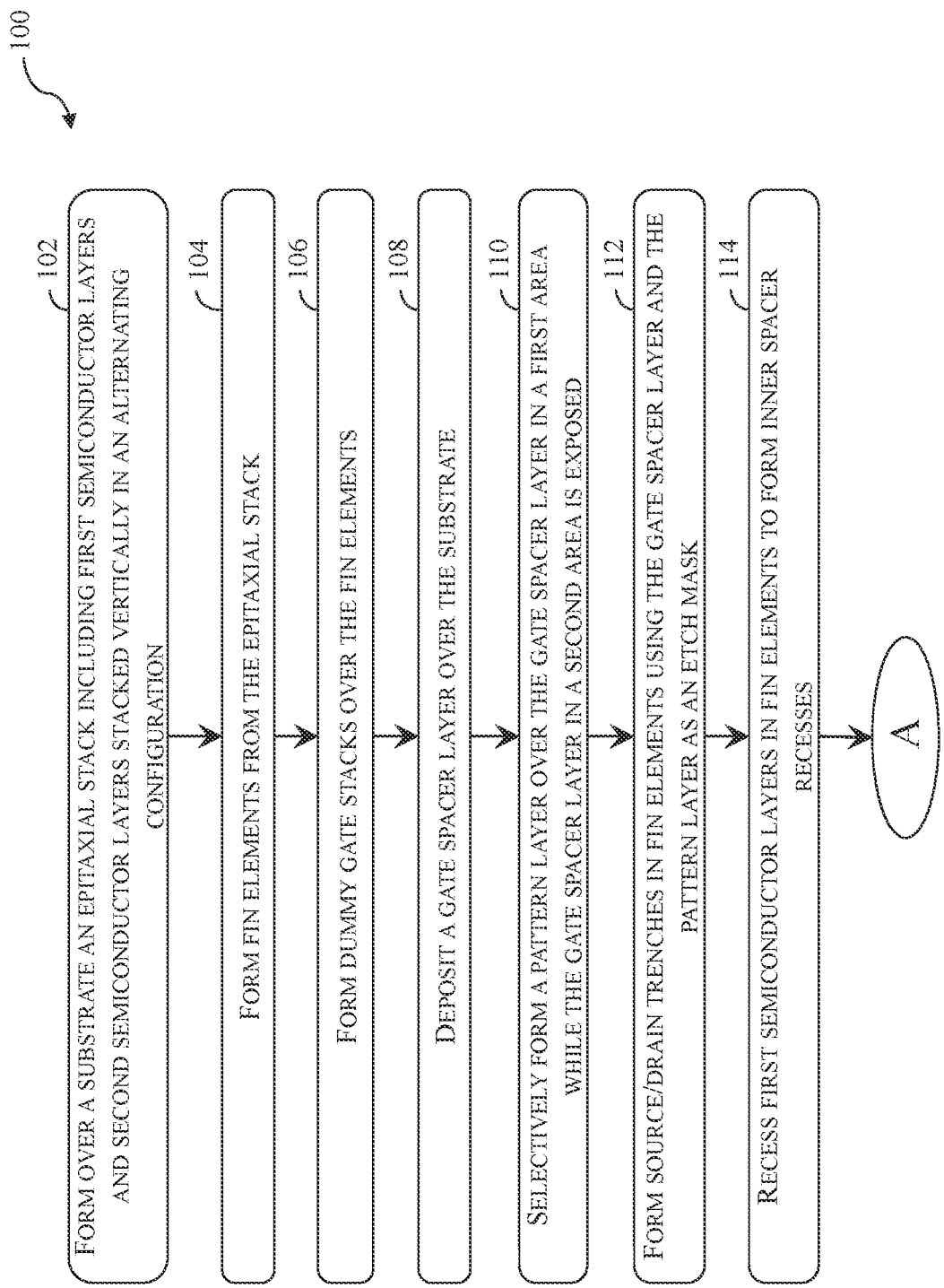
FIGS. 1A, 1B and 1C collectively illustrate a flow chart of a method for forming a semiconductor device having multiple device areas, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to fabricating gate-all-around (GAA) transistors in different device regions of a semiconductor device.

Multi-gate transistors include those transistors whose gate structures are formed on at least two-sides of a channel region. These multi-gate devices may include a p-type metal-oxide-semiconductor device or an n-type metal-oxide-semiconductor device. Examples of multi-gate transistors include FinFETs, on account of their fin-like structure and gate-all-around (GAA) devices. A GAA device includes any device that has its gate structure, or portion thereof, formed on 4-sides of a channel region (e.g., surrounding a portion of a channel region). Embodiments of the present disclosure may have channel regions disposed in nanowire channel(s), bar-shaped channel(s), nanosheet channel(s), nanostructure channel(s), column-shaped channel(s), postshaped channel(s), and/or other suitable channel configurations. Devices according to the present disclosure may have one or more channel regions (e.g., nanowires, nanosheets, nanostructures) associated with a single, contiguous gate structure. However, one of ordinary skill would recognize that the teachings in the present disclosure may be applicable to a single channel (e.g., single nanowire, single nanosheet, single nanostructure) or any number of channels. One of ordinary skill in art may recognize other examples of semiconductor devices that may benefit from aspects of the present disclosure.

As scales of the fin width in FinFETs decreases, channel width variations could cause undesirable variability and mobility loss. GAA transistors are being studied as an alternative to FinFETs. In a GAA transistor, the gate of the transistor is made all around the channel such that the channel is surrounded or wrapped by the gate. Such a transistor has the advantage of improving the electrostatic control of the channel by the gate, which also mitigates leakage currents. A GAA transistor includes various spacers, such as inner spacers and gate spacers (also termed as outer spacers, top spacers or main spacers). Inner spacers serve to reduce capacitance and prevent leaking between gate structure and source/drain features. During formation of a GAA transistor, gate spacers function as a mask during formation of source/drain trenches. During gate replacement process, gate spacers serve to maintain the integrity of the gate trenches after dummy gate stacks are removed to make room for metal gate stacks. Methods according to the present disclosure are designed to fabricate GAA transistors having different threshold voltages to form gate spacers of different thicknesses in different areas.

Figure 1B:
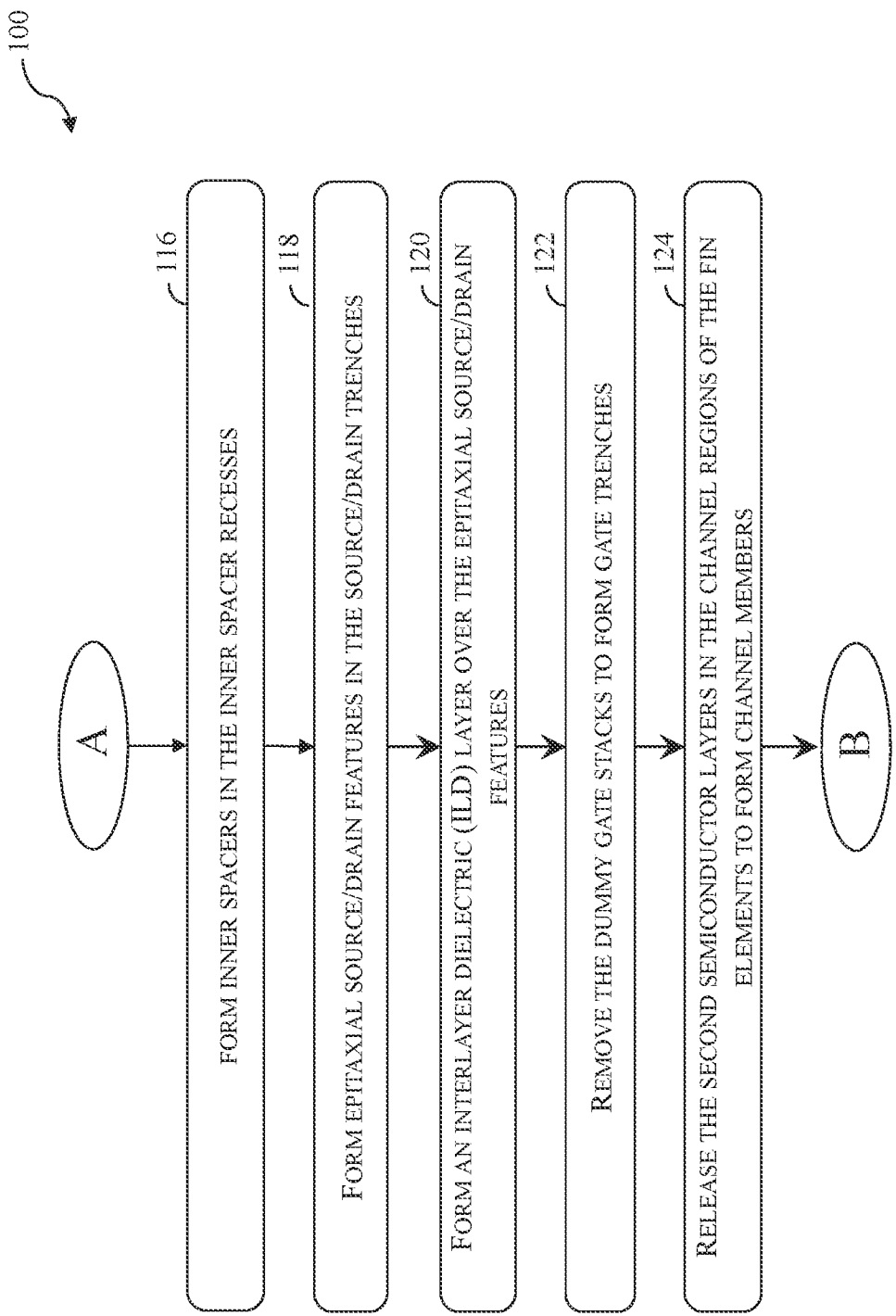
Figure 1C:
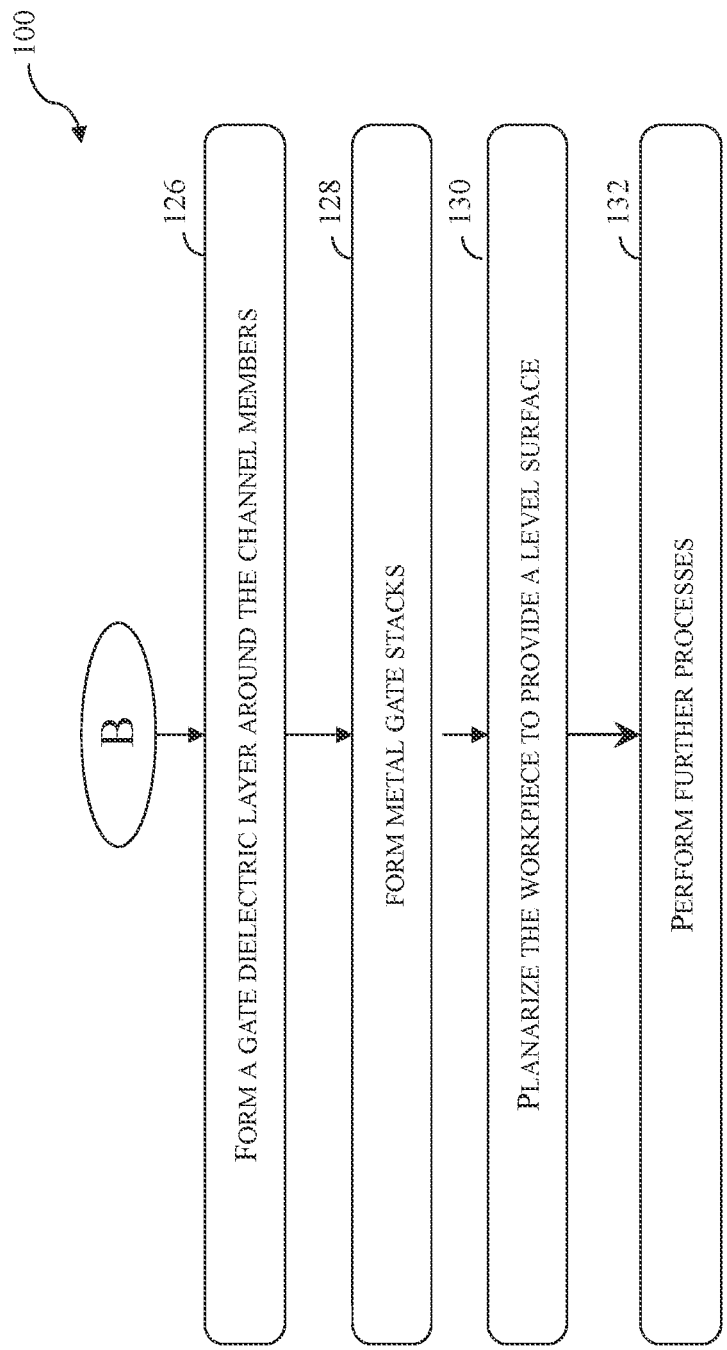

Illustrated in FIGS. 1A-1C is a method 100 of forming a semiconductor device having multiple device areas of multi-gate devices. As used herein, the term "multi-gate device" is used to describe a device (e.g., a semiconductor device) that has at least some gate material disposed on multiple sides of at least one channel of the device. In some examples, the multi-gate device may be referred to as a GAA device having gate material disposed on at least four sides of at least one channel of the device. The channel region may be referred to as a nanowire, nanosheet, nanostructure, channel member, semiconductor channel member, which, as used herein, includes channel regions of various geometries (e.g., cylindrical, bar-shaped, sheet-shaped) and various dimensions.

As with the other method embodiments and exemplary devices discussed herein, it is understood that parts of the workpiece 200 illustrated in FIGS. 2, 3, 4A-4B, 5A-5B, 6A-6B, 7A-7B, 8A-8B, 9A-9B, 10A-10B, 11A-11B, 12A-12B, 13A-13B, 14A-14B, 15, 16, 17, 18, 19, 20, 21, and 22A-22B may be fabricated by a CMOS technology process flow, and thus some processes are only briefly described herein. Upon conclusion of the fabrication process, the workpiece 200 will be fabricated into a semiconductor device 200. In that sense, the workpiece 200 may be referred to as the semiconductor device 200 in suitable context. Further, the exemplary semiconductor devices may include various other devices and features, such as other types of devices including additional transistors, bipolar junction transistors, resistors, capacitors, inductors, diodes, fuses, SRAM and/or other logic circuits, etc., but is simplified for a better understanding of the inventive concepts of the present disclosure. In some embodiments, the exemplary devices include a plurality of semiconductor devices (e.g., transistors), including n-type GAA transistors, p-type GAA transistors, PFETs, NFETs, etc., which may be interconnected. Moreover, it is noted that the process steps of method 100, including any descriptions given with reference to FIGS. 2, 3, 4A-4B, 5A-5B, 6A-6B, 7A-7B, 8A-8B, 9A-9B, 10A-10B, 11A-11B, 12A-12B, 13A-13B, 14A-14B, 15, 16, 17, 18, 19, 20, 21, and 22A-22B, as with the remainder of the method and exemplary figures provided in this disclosure, are merely exemplary and are not intended to be limiting beyond what is specifically recited in the claims that follow.

Referring to FIGS. 1A, 2 and 3, the method 100 includes block 102 where an epitaxial stack 204 is formed over a substrate 202. The epitaxial stack 204 includes first semiconductor layers 206 and the second semiconductor layers 208 stacked vertically in an alternating configuration. A workpiece 200 is illustrated in FIG. 2. The workpiece 200 includes a substrate 202, which may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type GAA transistors, p-type GAA transistors). The suitable doping may include ion implantation of dopants and/or diffusion processes. The substrate 202 may have isolation features interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In an embodiment of the method 100, an anti-punch through (APT) implant is performed. The APT implant may be performed in a region underlying the channel region of a device for example, to prevent punch-through or unwanted diffusion.

The epitaxial stack 204 includes first semiconductor layers 206 interposed by second semiconductor layers 208. The epitaxial stack 204 may also be referred to as a layer stack 204. As shown in FIG. 2, the first semiconductor layers 206 and the second semiconductor layers 208 are alternatingly and epitaxially deposited along the Z direction such that they are interleaved. Compositions of the first semiconductor layers 206 and second semiconductor layers 208 are different. In an embodiment, the first semiconductor layers 206 may be formed of silicon germanium (SiGe) and the second semiconductor layers 208 are formed of silicon (Si). However, other embodiments are possible including those that provide for a first semiconductor composition and a second semiconductor composition having different oxidation rates and/or etch selectivity. For example, either of the first semiconductor layers 206 and second semiconductor layers 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the second semiconductor layers 208 include the same material as the substrate 202. In some embodiments, the first semiconductor layers 206 and second semiconductor layers 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

It is noted that three (3) layers of the first semiconductor layers 206 and three (3) layers of the second semiconductor layers 208 are alternately arranged as illustrated in FIG. 2 as well as in other figures, which are for illustrative purposes only and not intended to be limiting beyond what is specifically recited in the claims. It can be appreciated that any number of epitaxial layers can be formed in the epitaxial stack 204. The number of layers depends on the desired number of channels members for the device 200. In some embodiments, a number of second semiconductor layers 208 is between 2 and 10.

In some embodiments, each of the first semiconductor layers 206 has a thickness ranging from about 2 nanometers (nm) to about 6 nm, such as 3 nm in a specific example. The first semiconductor layers 206 may be substantially uniform in thickness. In some embodiments, each of the second semiconductor layers 208 has a thickness ranging from about 6 nm to about 12 nm, such as 9 nm in a specific example. In some embodiments, the second semiconductor layers 208 of the epitaxial stack 204 are substantially uniform in thickness. As described in more detail below, the second semiconductor layers 208 or parts thereof may serve as channel member(s) for a subsequently-formed multi-gate device and the thickness is chosen based on device performance considerations. The first semiconductor layers 206 in channel regions(s) may eventually be removed and serve to define a vertical distance between adjacent channel region(s) for a subsequently-formed multi-gate device and the thickness is chosen based on device performance considerations. Accordingly, the first semiconductor layers 206 may also be referred to as sacrificial layers 206, and second semiconductor layers 208 may also be referred to as channel layers 208.

Referring to FIGS. 1A, 3, 4A, 4B, 5A, and 5B, the method 100 includes a block 104 where fin elements 211 are formed from the epitaxial stack 204. Referring first to FIG. 3, a fin top hard mask layer 210 may be deposited over the workpiece 200. The fin top hard mask layer 210 may be a single layer or a multilayer. In some implementations, the fin top hard mask layer 210 may include silicon oxide, silicon nitride, silicon oxynitride, silicon oxycarbonitride, silicon carbide, or a combination thereof. In embodiments where the fin top hard mask layer 210 is a multilayer, the fin top hard mask layer 210 may include a silicon oxide layer deposited on the epitaxial stack and a silicon nitride layer deposited on the silicon oxide layer. The fin top hard mask layer 210 is used in a patterning process to pattern the fin top hard mask layer 210 to form fin elements 211 shown in FIGS. 4A and 4B. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. The patterning process may be performed to the workpiece 200 until fin elements 211 extend from the substrate 202. In some embodiments, the patterning also etches into the substrate 202 such that each of the fin elements 211 includes a lower portion formed from the substrate 202 and an upper portion formed from the epitaxial stack 204. The upper portion includes each of the epitaxial layers of the epitaxial stack 204 including sacrificial layers 206 and channel layers 208. In some embodiments, the fin elements 211 may be fabricated using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin elements 211 by etching the epitaxial stack 204. The etching process can include dry etching, wet etching, reactive ion etching (RIE), and/or other suitable processes. As shown in FIGS. 4A and 4B, fin elements 211 extend lengthwise along the X direction.

Reference is now made to FIGS. 5A and 5B. After the fin elements 211 are formed, isolation feature 212 is formed between neighboring fin elements 211. The isolation feature 212 may also be referred to as a shallow trench isolation (STI) feature 212. By way of example, in some embodiments, a dielectric layer is first deposited over the substrate 202, filling the trenches between fin elements 211 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the STI features 212. After the recess, at least the upper portions of the fin elements 211 rise above the STI features 212. In some embodiments, the dielectric layer (and the subsequently formed STI features 212) may include a multi-layer structure, for example, having one or more liner layers.

In some embodiments not separately illustrated in the present disclosure, dielectric fins may also be formed at block 104 of method 100. In an example process flow to form dielectric fins, a slit that extend in parallel with the fin elements 211 is formed within the dielectric material for the STI feature 212 and dielectric fin material is then deposited into the slit. The dielectric fin material is different from the dielectric material that forms the STI features 212. This allows the dielectric layer for the STI features 212 to be selectively etched, leaving behind the dielectric fins that rise above the STI features 212. In some embodiments, the dielectric fin material may include silicon nitride, silicon carbonitride, silicon carbide, aluminum oxide, zirconium oxide, or other suitable materials. In embodiments where dielectric fins are deployed, dielectric fins interpose between the fin elements 211 and serve to separate source/drain features of neighboring devices. The dielectric fins may also be referred to as dummy fins or hybrid fins. In some alternative embodiments, an upper portion of the dielectric fins may be removed during a gate cut process and replaced by a reverse material feature that may be different or similar to that of the dielectric fins. When formed, the dielectric fins restrict the formation of epitaxial source/drain features and prevent undesirable mergers between adjacent epitaxial source/drain features.

Referring still to FIGS. 1A, 6A, 6B, 7A, and 7B, method 100 includes a block 106 where dummy gate stacks 220 are formed over channel regions 30 of the fin elements 211. In some embodiments, a gate replacement process (or gate-last process) is adopted where the dummy gate stacks 220 serve as placeholders for metal gate stacks and are to be removed and replaced by the metal gate stacks in a subsequent process. Other processes and configuration are possible. Reference is now made to FIGS. 6A and 6B. To form dummy gate stacks 220, a dummy dielectric layer 214, which may be formed of silicon oxide, silicon nitride, or other suitable dielectric material, is first deposited by a CVD process, a sub-atmospheric CVD (SACVD) process, a flowable CVD process, an ALD process over the workpiece 200, including over the fin elements 211. The dummy dielectric layer 214 may be used to prevent damages to the fin elements 211 by subsequent processes (e.g., formation of the dummy gate stack). A dummy gate material layer 216, which may be formed of polysilicon, is then deposited over the dummy dielectric layer 214. For patterning purposes, a gate top hard mask 218 may be deposited over the dummy gate material layer 216. The gate top hard mask 218 may be a single layer or a multilayer and may include silicon oxide, silicon nitride, silicon oxynitride, silicon carbide, silicon oxycarbonitride, or a combination thereof. In instances where the gate top hard mask 218 is a multilayer, the gate top hard mask 218 includes a silicon oxide layer deposited on the dummy gate material layer 216 and a silicon nitride layer deposited on the silicon oxide layer. The gate top hard mask 218, the dummy gate material layer 216, and the dummy dielectric layer 214 are patterned by a patterning process that may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

Figures 7A, 7B:
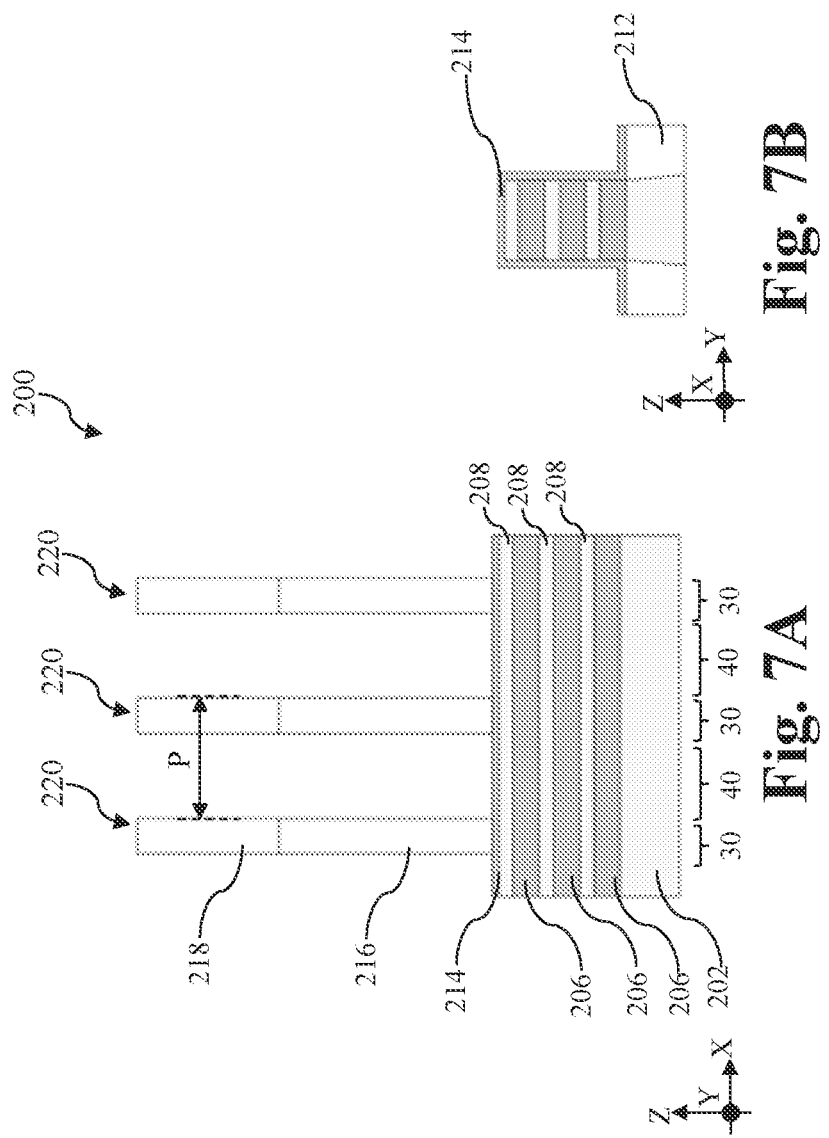

Referring to FIGS. 7A and 7B, dummy gate stacks 220 are formed over the substrate 202 and are at least partially disposed over the fin elements 211. After patterning, the dummy gate material layer 216 is shaped into dummy electrode 216. The portions of the fin elements 211 underlying the dummy gate stacks 220 are the channel region 30 of the fin element 211. The dummy gate stacks 220 may also define source/drain (S/D) regions 40 adjacent to and on opposing sides of the channel region 30. As shown in FIG. 7A, each of the channel regions 30 may be sandwiched along the X direction between two source/drain regions 40. In some embodiments, after formation of the dummy gate stack 220, the dummy dielectric layer 214 is removed from the source/drain regions 40 of the fin elements 211. That is, the dummy dielectric layer 214 that is not covered by the dummy electrode 216 is removed. The removal process may include a wet etch, a dry etch, and/or a combination thereof. The etch process is chosen to selectively etch the dummy dielectric layer 214 without substantially etching the fin elements 211, the gate top hard mask 218, and the dummy electrode 216. As shown in FIG. 7A, the dummy gate stacks 220 are disposed at a uniform pitch P throughout the workpiece 200.

Referring to FIGS. 1A, 8A and 8B, the method 100 includes a block 108 where a gate spacer layer 221 is deposited over the substrate 202, including over the dummy gate stacks 220. In some embodiments, spacer material for forming the gate spacer layer 221 is deposited conformally over the workpiece 200, including over top surfaces and sidewalls of the dummy gate stack 220. The term "conformally" may be used herein for ease of description of a layer having substantially uniform thickness over various regions. The gate spacer layer 221 may have a single-layer construction or include multiple layers. In some embodiments represented in FIGS. 8A and 8B, the gate spacer layer 221 includes a single-layer construction. The gate spacer layer 221 may include silicon oxide, silicon oxynitride, silicon nitride, silicon carbonitride, silicon oxycarbide, silicon oxycarbonitride, other suitable dielectric material, or a combination thereof. The spacer material may be deposited over the dummy gate stack 220 using processes such as, CVD process, a subatmospheric CVD (SACVD) process, a flowable CVD process, an ALD process, or other suitable process. The spacer material is then etched back in an anisotropic etch process to form the gate spacer layer 221. The anisotropic etch process exposes portions of the fin elements 211 adjacent to and not covered by the dummy gate stack 220 (e.g., in source/drain regions 40). Although not explicitly shown in FIGS. 8A and 8B, portions of the spacer material directly above the dummy gate stack 220 may be partially or completely removed by this anisotropic etching process while the gate spacers layer 221 remain on sidewalls of the dummy gate stack 220.

Referring to FIGS. 1A, 9A and 9B, the method 100 includes a block 110 where a pattern layer 224 is selectively formed over the gate spacer layer 221 in the first area 10 while the gate spacer layer 221 in the second area 20 is exposed. In some embodiments, the pattern layer 224 may be formed of a dielectric material or a polymeric material. For example, such a dielectric material may include silicon oxide, silicon nitride, silicon oxynitride, silicon oxycarbonitride, silicon oxycarbide, or other suitable dielectric material. Such a polymeric material may be a photoresist material or polyimide. In some implementations, the polymeric material may include fluorine and carbon in the form of a fluorocarbon ($CF_x$, x=1, 2, or 3) functional group or a chlorocarbon ($CCl_x$, x=1, 2, or 3) functional group. The pattern layer 224 may be deposited using chemical vapor deposition (CVD) or a spin-on coating process. As compared to the unprotected/uncovered spacer layer 221 on dummy gate stacks 220 in the second area, the pattern layer 224 in the first area 10 provides additional etching resistance to the gate spacer layer 221 on dummy gate stacks 220 in the first area 10. As will be described below in conjunction with FIGS. 12A and 12B, such additional etching resistance cause a thicker first gate spacer layer 222 in the first area 10 and a thinner second gate spacer layer 222' in the second area 20.

Figures 10A, 10B:
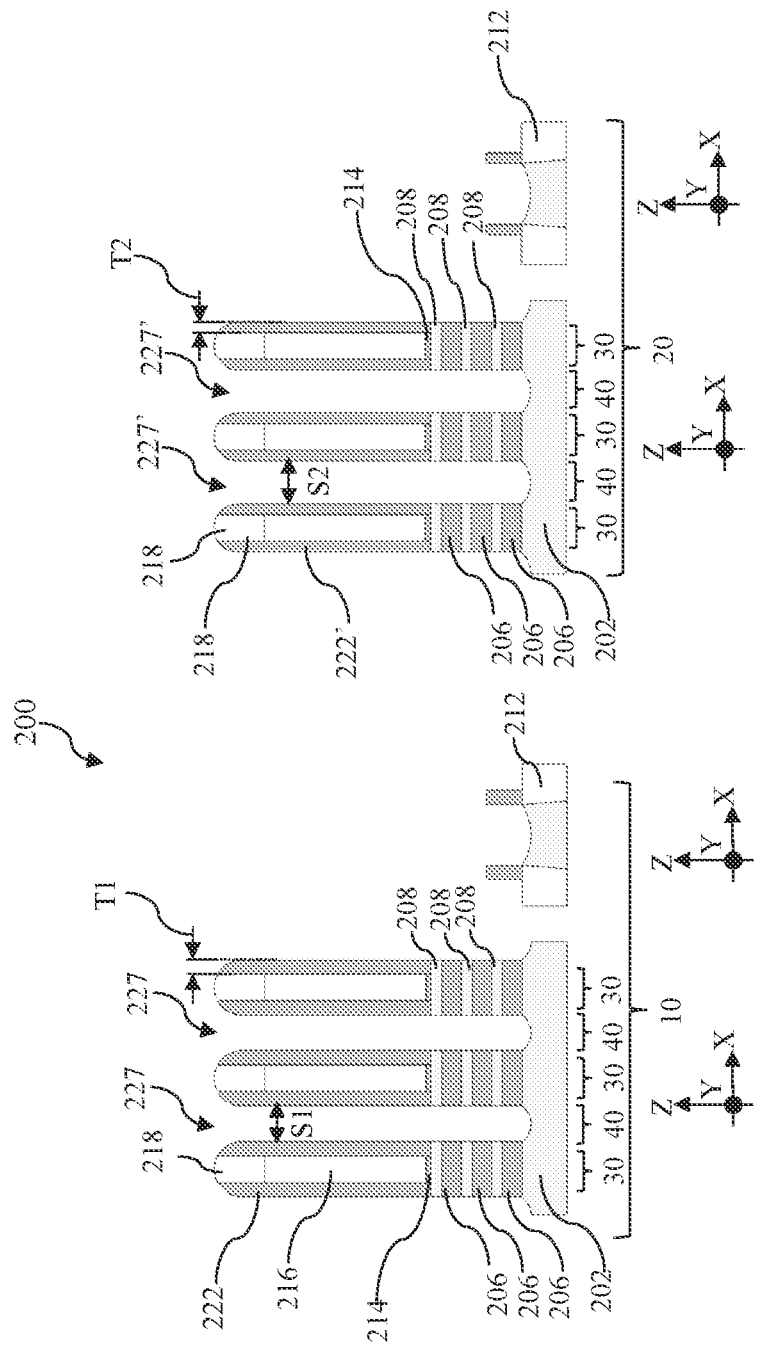

Referring to FIGS. 1A, 10A, and 10B, the method 100 includes a block 112 where source/drain trenches 227 or 227' are formed in the fin elements 211 using first gate spacer layer 222, the pattern layer 224, and the second gate spacer layer 222' as an etch mask. In some embodiments, source/drain regions 40 of the fin elements 211 in the first area 10 are recessed to form first source/drain trenches 227 and source/drain regions 40 of the fin elements 211 in the second area 20 are recessed to form second source/drain trenches 227'. While not explicitly shown, a photolithography process and at least one hard mask may be used to perform operations at block 112. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As described above in association with block 110, the etching at block 112 etches and removes the pattern layer 224 before it etches the first gate spacer layer 222. The implementation of the pattern layer 224 slows down the thinning of the gate spacer layer 221 in the first area 10, resulting in the first gate spacer layer 222 being thicker than the second gate spacer layer 222'. In some embodiments, the first gate spacer layer 222 has a first thickness T1 and the second gate spacer layer 222' has a second thickness T2. In some instances, the first thickness T1 is greater than the second thickness T2 by a difference between about 0.5 nm and about 5 nm. Because of the thickness difference between the first gate spacer layer 222 and the second gate spacer layer 222' and the uniform pitch P across the workpiece 200, the first source/drain trenches 227 in the first area 10 is narrower than the second source/drain trench 227' in the second area 20. The first source/drain trenches 227 in the first area 10 has a first spacing S1 along the X direction and the second source/drain trench 227' in the second area 20 has a second spacing S2 along the X direction. The second spacing S2 is greater than the first spacing S1. In some instances, the first spacing S1 is between about 10 nm and about 40 nm and the second spacing S2 is between about 15 nm and about 45 nm. In some embodiments represented in FIGS. 10A and 10B, the upper portion of the fin elements 211 are recessed to expose the sacrificial layers 206 and the channel layers 208. In some implementations, at least a portion of the lower portion of the fin elements 211 are recessed as well. That is, the first source/drain trenches 227 and the second source/drain trench 227' may extend below the bottom-most sacrificial layer 206 in the first area 10 and the second area 20. Upon conclusion of operations in block 112, the source/drain regions 40 of the fin elements 211 may become level with to or lower than the top surface of the STI features 212.

Figures 12A, 12B:
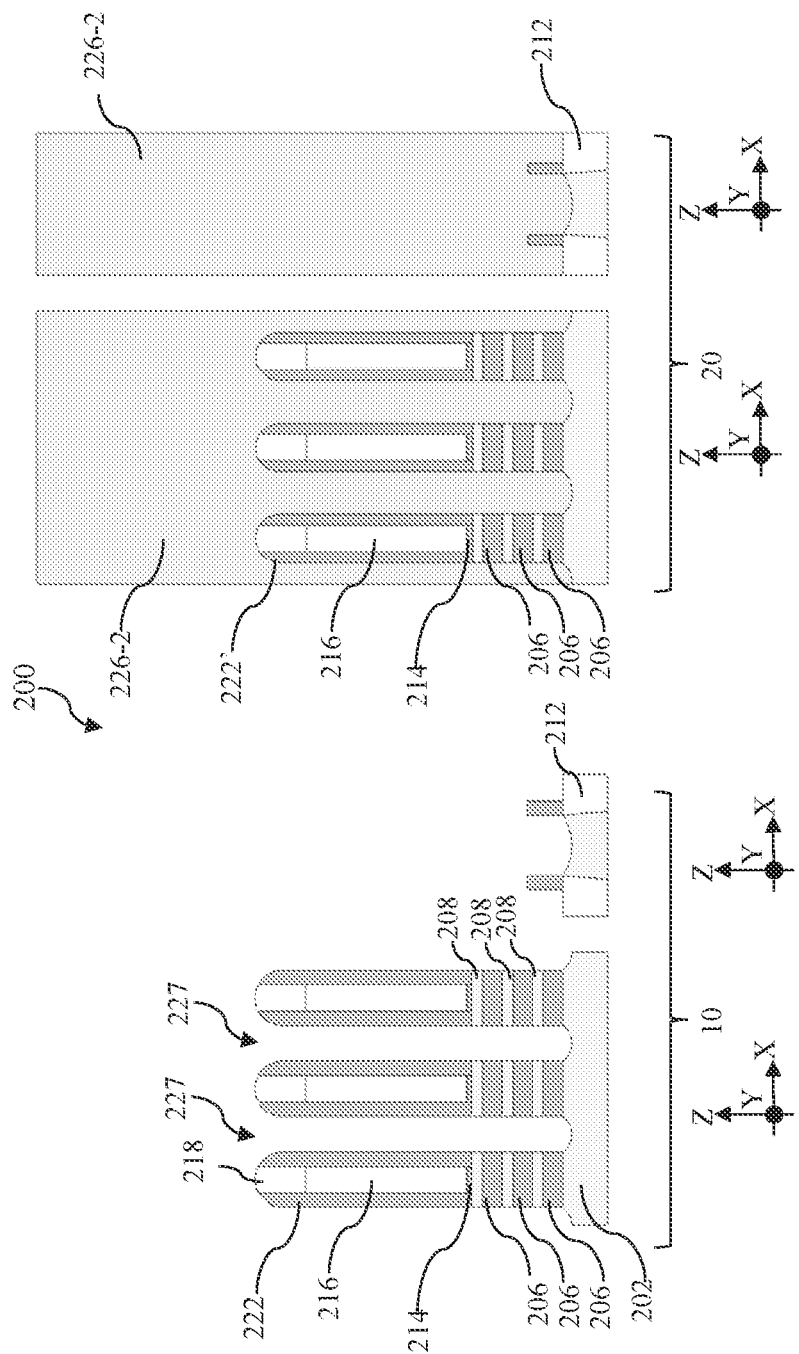

Alternative embodiments of operations at block 110 and block 112 are illustrated in FIGS. 11A, 11B, 12A, and 12B. In these alternative embodiments, no pattern layer 224 is selectively deposited in the first area 10. Instead, after the gate spacer layer 221 is formed over the workpiece 200 at block 108, the first source/drain trenches 227 in the first area 10 and the second source/drain trench 227' in the second area 20 are separately formed. As illustrated in FIGS. 11A and 11B, a first photoresist layer 226-1 is selectively deposited in the first area 10 and the fin elements 211 in the second area 20 of the workpiece 200 is anisotropically etched in a first etch back process to form the second source/drain trench 227'. Thereafter, as illustrated in FIGS. 12A and 12B, a second photoresist layer 226-2 is selectively deposited in the second area 20 and the fin elements 211 in the first area 10 of the workpiece 200 is anisotropically etched in a second etch back process to form the first source/drain trenches 227. Parameters of the first etch back process and the second etch back process may be different such that the first etch back process etches the gate spacer layer 221 in the second area 20 faster than the second etch back process etches the gate spacer layer in the first area 10. For example, the first etch back process may include different etchant, lower process pressure, higher bias, higher plasma density, more reactive etchants, or higher temperature than the second etch back process.

Figures 13A, 13B:
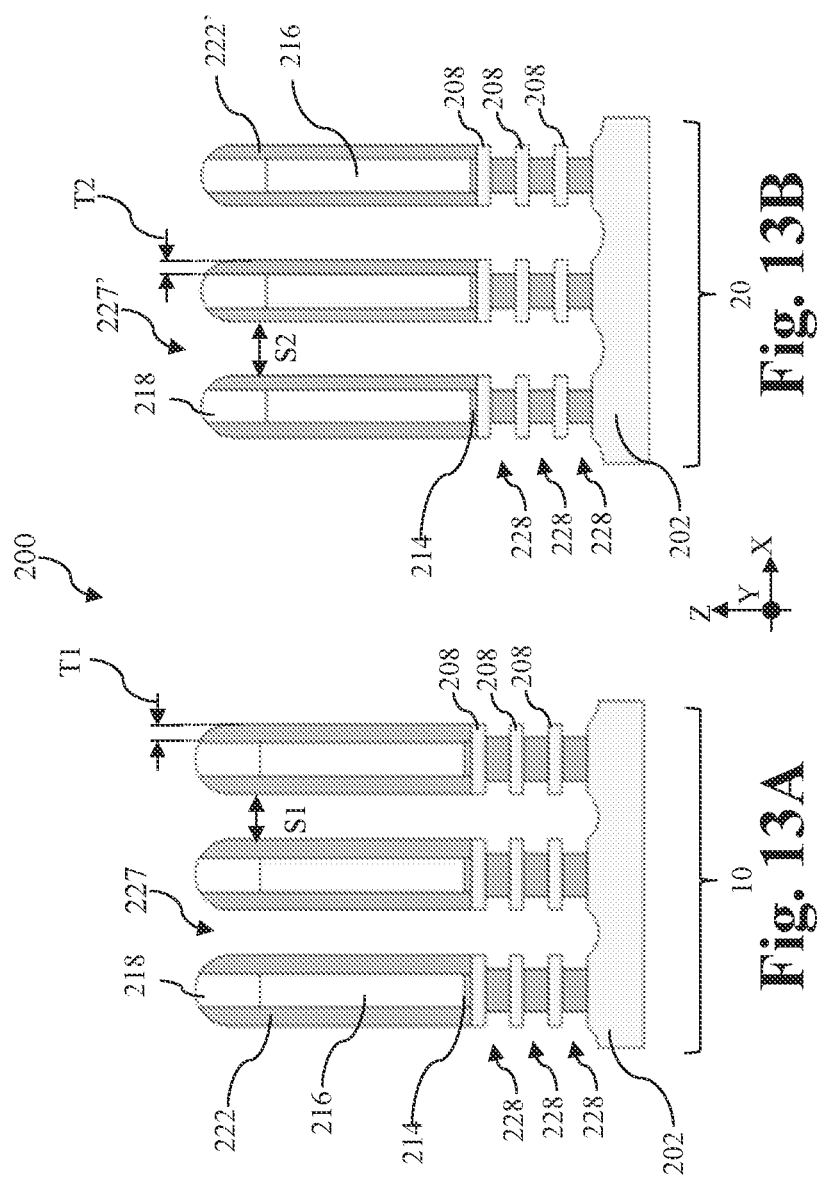

Referring to FIGS. 1A, 13A and 13B, the method 100 includes block 114 where the first semiconductor layers 206 in the fin elements 211 in first area 10 and second area 20 are recessed to form inner spacer recesses 228. In some embodiments represented in FIGS. 13A and 13B, the sacrificial layers 206 exposed in the first source/drain trenches 227 and the second source/drain trench 227' are selectively and partially recessed to form inner spacer recesses 228 while the exposed channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. As shown in FIGS. 13A and 13B, the inner spacer recesses 228 extend inward from the first source/drain trenches 227 in the first area 10 or from the second source/drain trench 227' in the second area 20. In some embodiments, the selective wet etching process may include a hydro fluoride (HF) or $NH_4OH$ etchant. Although the first gate spacer layer 222 in the first area 10 and the second gate spacer layer 222' in the second area 20 have different thicknesses, the inner spacer recesses 228 have substantially uniform dimensions across the workpiece 200. That is, the inner spacer recesses 228 in the first area 10 and the inner spacer recesses 228 in the second area 20 extend inwardly into the sacrificial layers 206 in substantially equal amount.

Referring to FIGS. 1B, 14A and 14B, the method 100 includes a block 116 where inner spacers 230 are formed in the inner spacer recesses 228. In some embodiments, an inner spacer layer may be deposited over the workpiece 200 by CVD, PECVD, LPCVD, ALD or other suitable method. The inner spacer layer may be formed of aluminum oxide, zirconium oxide, tantalum oxide, yttrium oxide, titanium oxide, lanthanum oxide, silicon oxide, silicon carbonitride, silicon oxycarbonitride, silicon oxycarbide, low-k material, other suitable metal oxide, or a combination thereof. In some implementations, the inner spacer layer may be deposited conformally over the top surface of the gate top hard mask 218, top surfaces and sidewalls of the first gate spacer layer 222, top surfaces and sidewalls of the second gate spacer layer 222', portions of the substrate 202 exposed in the first source/drain trenches 227 and the second source/drain trench 227'. Subsequently, the deposited inner spacer layer may be etched back to form inner spacers 230 in the inner spacer recesses 228. In the etch back process, inner spacer layer outside the inner spacer recesses 228 is removed.

Figure 15:
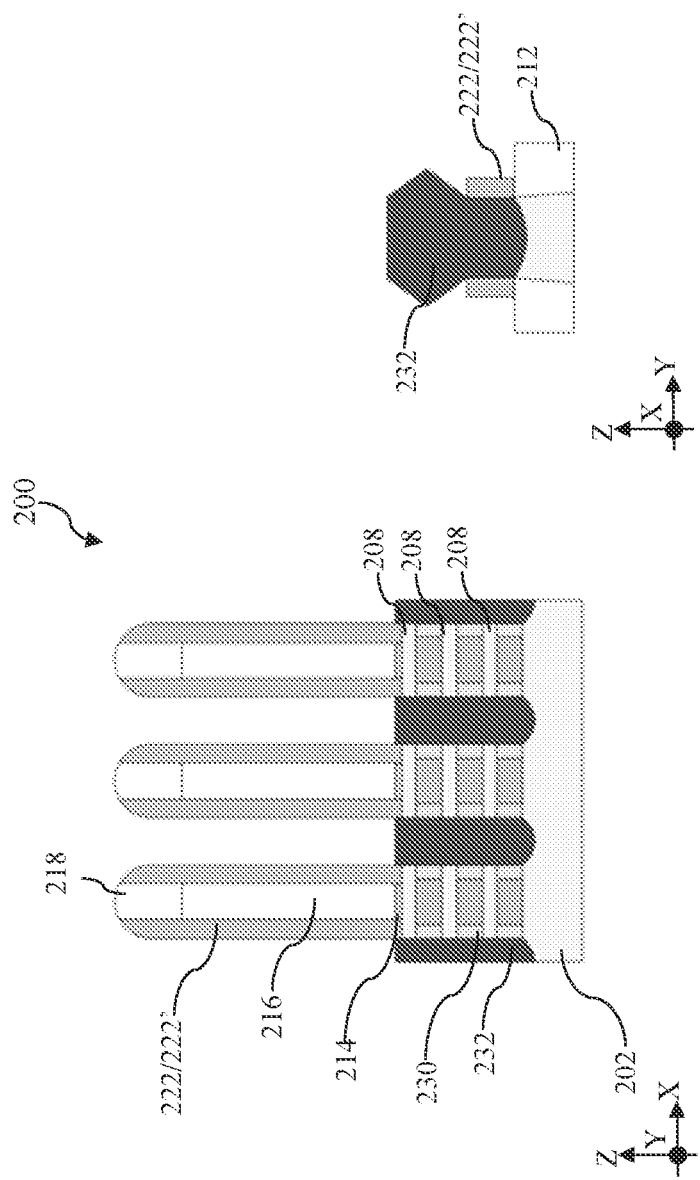

Referring to FIGS. 1B and 15, the method 100 includes a block 118 where the epitaxial source/drain features 232 in the first source/drain trenches 227 and second source/drain trenches 227'. As the formation of the epitaxial source/drain features 232 is substantially the same throughout the workpiece 200, formation of the epitaxial source/drain feature 232 in the first area 10 and the second area 20 is collectively illustrated in FIG. 15. Although not separately shown in figures of the present disclosure, the epitaxial source/drain features 232 may include n-type epitaxial source/drain feature for n-type devices and p-type epitaxial source/drain feature for p-type devices. In some embodiments, n-type epitaxial source/drain features of n-type devices in the workpiece 200 may be formed together while p-type epitaxial source/drain features of p-type devices in the workpiece 200 may be formed together in a preceding or a subsequent process. The epitaxial source/drain features 232 may be formed using suitable epitaxial processes, such as CVD deposition techniques (e.g., vapor-phase epitaxy (VPE), ultra-high vacuum CVD (UHV-CVD)), molecular beam epitaxy (MBE), and/or other suitable processes. Example n-type epitaxial source/drain features may include Si, GaAs, GaAsP, SiP, or other suitable material. The n-type epitaxial source/drain features may be in-situ doped during the epitaxial process by introducing doping species including n-type dopants, such as phosphorus or arsenic; and/or other suitable dopants including combinations thereof. If the n-type epitaxial source/drain features are not in-situ doped, an implantation process (i.e., a junction implant process) is performed to dope the n-type epitaxial source/drain features. Example p-type epitaxial source/drain features may include Si, Ge, AlGaAs, SiGe, boron-doped SiGe, or other suitable material. The p-type epitaxial source/drain features may be in-situ doped during the epitaxial process by introducing doping species including p-type dopants, such as boron or $BF_2$, and/or other suitable dopants including combinations thereof. If the p-type epitaxial source/drain features are not in-situ doped, an implantation process (i.e., a junction implant process) is performed to dope the p-type epitaxial source/drain features.

Figure 16:
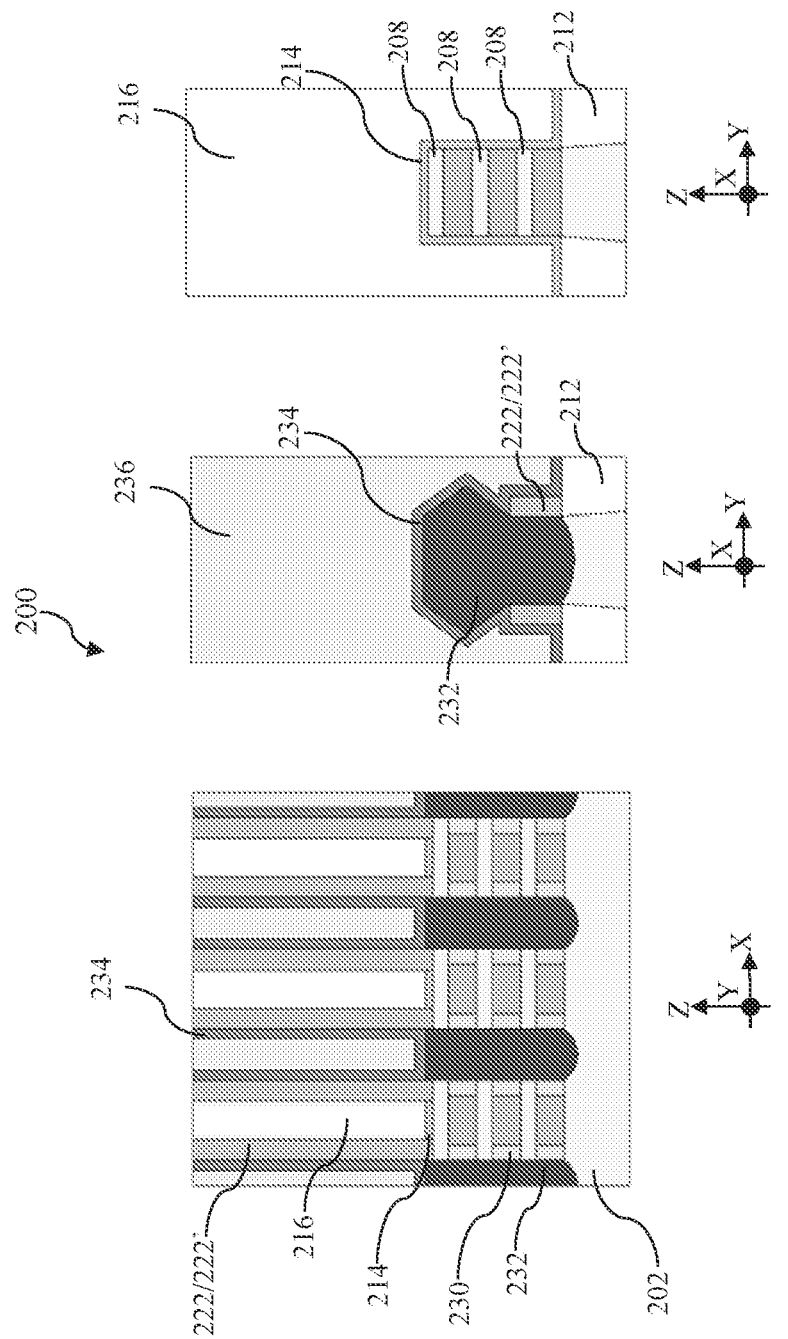

Referring to FIGS. 1B and 16, the method 100 includes a block 120 where an interlayer dielectric (ILD) layer 236 is formed over the epitaxial source/drain features 232. As the formation of the ILD layer 236 is substantially the same throughout the workpiece 200, formation of the ILD layer 236 in the first area 10 and the second area 20 is collectively illustrated in FIG. 16. In some embodiments, a contact etch stop layer (CESL) 234 is first deposited on the epitaxial source/drain features 232. In some examples, the CESL 234 includes a silicon nitride layer, a silicon oxide layer, a silicon oxynitride layer, and/or other materials known in the art. The CESL 234 may be formed by ALD, plasma-enhanced chemical vapor deposition (PECVD) process and/or other suitable deposition or oxidation processes. Then the ILD layer 236 is deposited over the CESL 234. In some embodiments, the ILD layer 236 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 236 may be deposited by a PECVD process or other suitable deposition technique. In some embodiments, after formation of the ILD layer 236, the workpiece 200 may be annealed to improve integrity of the ILD layer 236. After the deposition and annealing of the ILD layer 236, the workpiece 200 is planarized by, for example, a chemical mechanical polishing (CMP) process, to form a level top surface for further processing.

Figure 17:
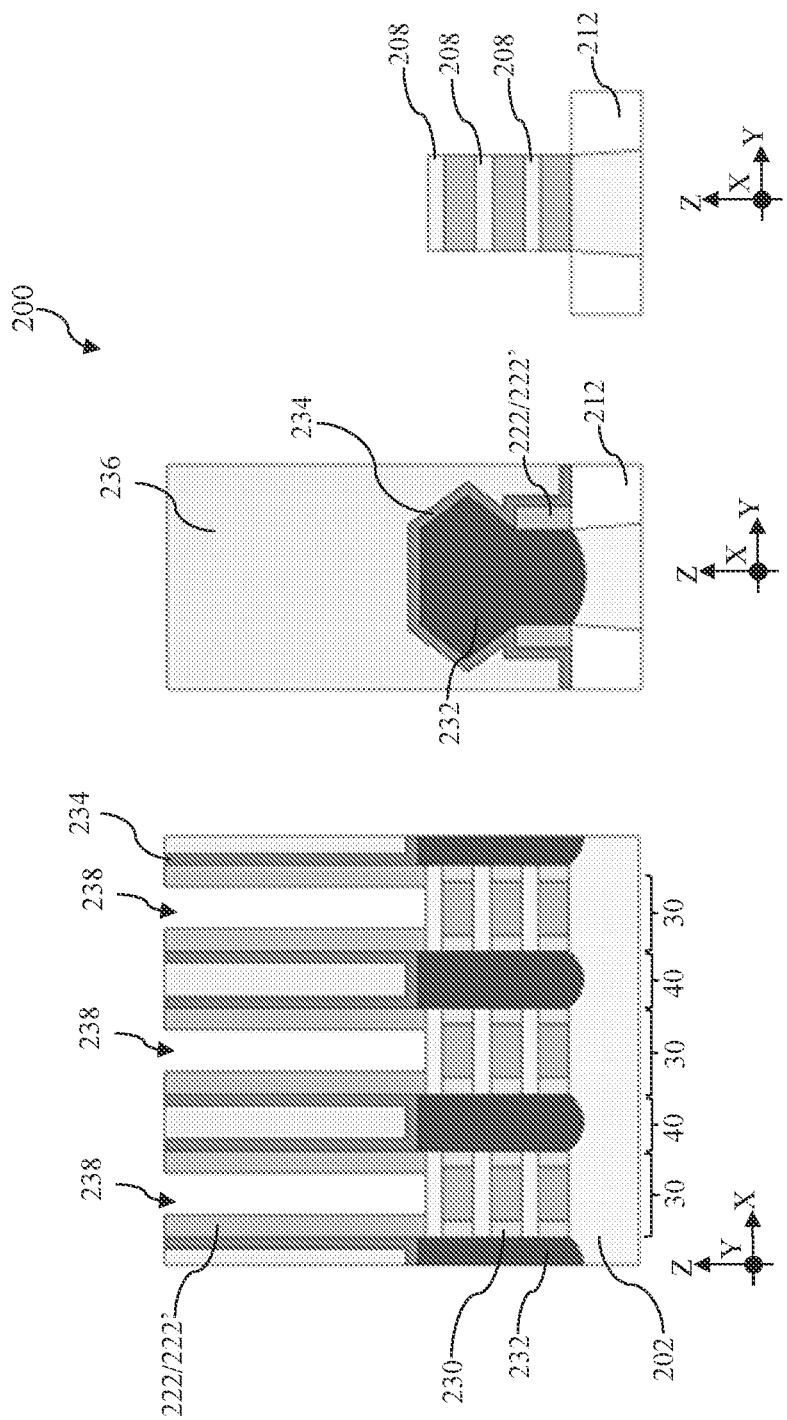

Referring to FIGS. 1B and 17, the method 100 includes a block 122 where the dummy gate stacks 220 are removed to form gate trenches 238. As the removal of the dummy gate stacks 220 is substantially the same throughout the workpiece 200, removal of the dummy gate stacks 220 in the first area 10 and the second area 20 is collectively illustrated in FIG. 17. In the depicted embodiment, an etching process completely removes dummy gate stacks 220 to expose sacrificial layers 206 and channel layers 208 in channel regions 30. The etching process may be a dry etching process, a wet etching process, other suitable etching process, or combinations thereof. The etching process may be selected such that it is selective to the dummy gate stacks 220 and does not substantially etch the CESL 234 and the ILD layer 236. In some implementation represented in FIG. 17, both the dummy gate stacks 220 and the dummy dielectric layer 214 are removed from the channel region 30 to expose the sacrificial layers 206 and channel layers 208 in channel regions 30.

Figure 18:
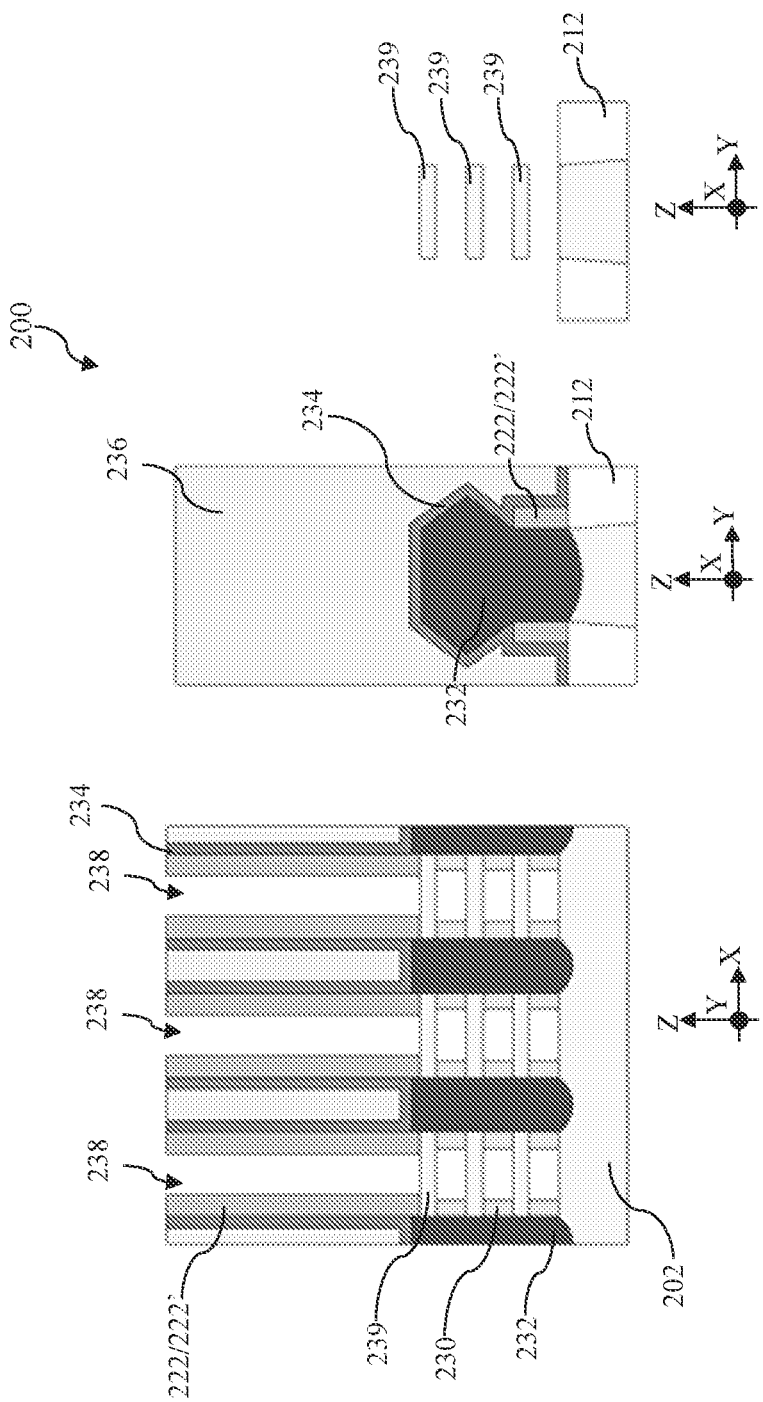

Referring to FIGS. 1B and 18, the method 100 includes a block 124 where the second semiconductor layers 208 in the channel regions of the fin elements 211 are released to form channel members 239. As the release of the second semiconductor layers 208 is substantially the same throughout the workpiece 200, release of the second semiconductor layers 208 in the first area 10 and the second area 20 is collectively illustrated in FIG. 18. In the depicted embodiment, an etching process selectively etches the first semiconductor layer 206 (i.e., sacrificial layers 206) with minimal or no etching of second semiconductor layers 208 (i.e., channel layers 208) and, in some embodiments, minimal or no etching of first gate spacer layer 222, the second gate spacer layer 222', and/or inner spacers 230. Various etching parameters can be tuned to achieve selective etching of first semiconductor layers 206, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of the first semiconductor layers 206 (in the depicted embodiment, silicon germanium) at a higher rate than the material of the second semiconductor layers 208 (in the depicted embodiment, silicon) (i.e., the etchant has a high etch selectivity with respect to the material of first semiconductor layers 206). The etching process may be a dry etching process, a wet etching process, other suitable etching process, or combinations thereof. In some embodiments, a dry etching process (such as an RIE process) utilizes a fluorine-containing gas (for example, $SF_6$) to selectively etch the first semiconductor layers 206 (i.e., sacrificial layers 206). In some embodiments, a ratio of the fluorine-containing gas to an oxygen-containing gas (for example, $O_2$ or $O_3$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch the first semiconductor layers 206 (i.e., sacrificial layers 206). In some embodiments, a chemical vapor phase etching process using hydrochloric acid (HCl) selectively etches the first semiconductor layers 206 (i.e., sacrificial layers 206). Upon conclusion of the operations at block 124, the channel layers 208 in the channel regions 30 become suspended and may be referred to as channel members 239. As will be described in more detail below in conjunction with FIGS. 22A and 22B, channel members 239 in the first area 10 may have a greater channel length along the X direction than those in the second area 20 due to the thicker first gate spacer layer 222 in the first area 10.

Figure 19:
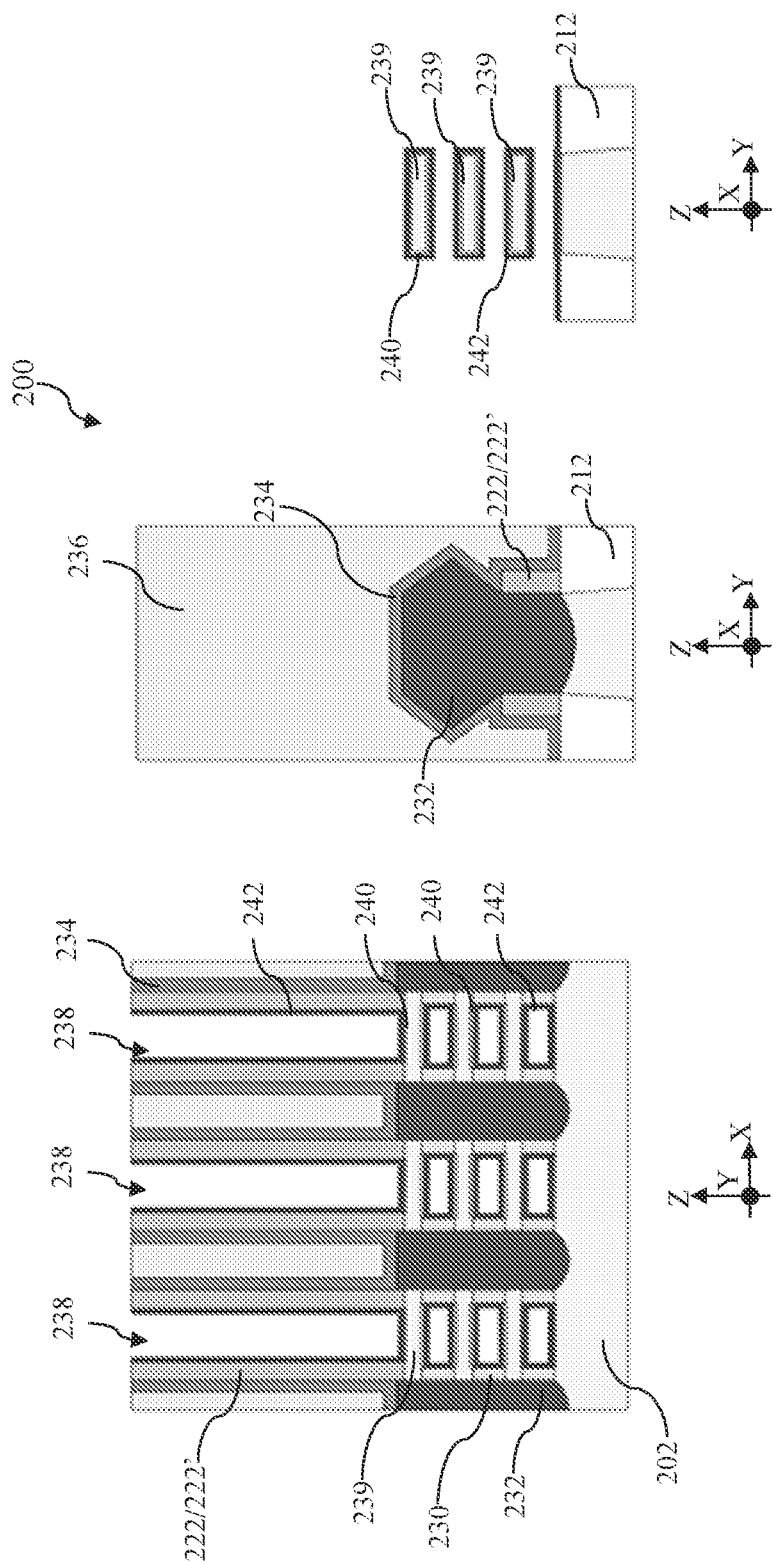

Referring to FIGS. 1C and 19, the method 100 includes a block 126 where a gate dielectric layer 242 is formed around the channel members 239. As the formation of the gate dielectric layer 242 is substantially the same throughout the workpiece 200, the formation of the gate dielectric layer 242 in the first area 10 and the second area 20 is collectively illustrated in FIG. 19. In some embodiments, an interfacial layer 240 may be formed on the channel members 239 to provide adhesion between the channel members 239 and the gate dielectric layer 242. In some implementations, the interfacial layer 240 may include a dielectric material such as silicon oxide, hafnium silicate, or silicon oxynitride. The interfacial layer 240 may be formed by chemical oxidation, thermal oxidation, atomic layer deposition (ALD), chemical vapor deposition (CVD), and/or other suitable method. The gate dielectric layer 242 is deposited over and around the channel members 239 and may include one or more high-k dielectric materials. High-k dielectric materials, as used and described herein, include dielectric materials having a high dielectric constant, for example, greater than that of thermal silicon oxide (~3.9). Example high-K dielectric material for the gate dielectric layer 242 may include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), other high-k dielectric material, or combinations thereof. The gate dielectric layer 242 may be formed by ALD, physical vapor deposition (PVD), CVD, oxidation, and/or other suitable methods.

Figure 20:
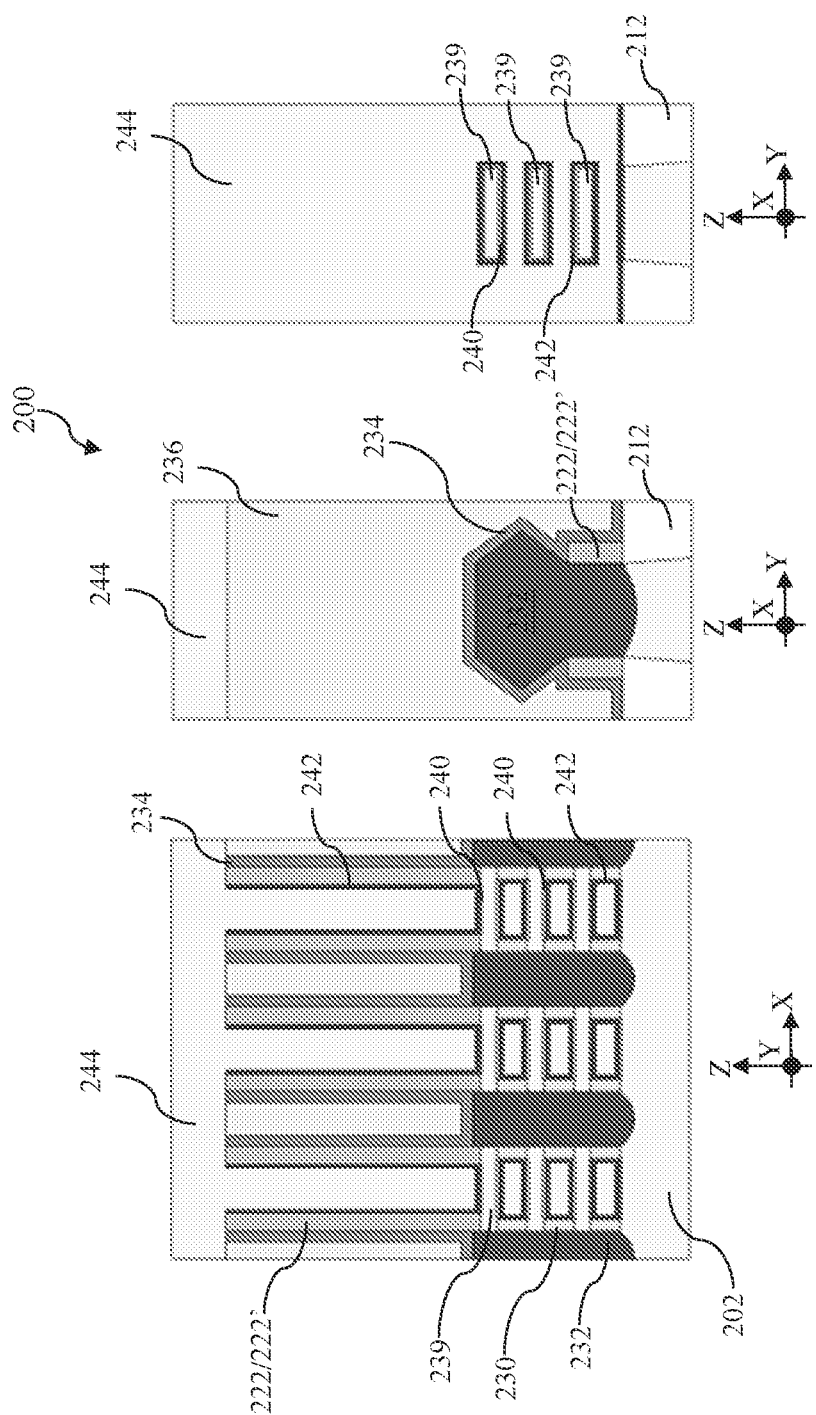

Referring to FIGS. 1C and 20, the method 100 includes a block 128 where metal gate stacks 244 are formed. As the formation of the metal gate stacks 244 is substantially the same throughout the workpiece 200, the formation of the metal gate stacks 244 in the first area 10 and the second area 20 is collectively illustrated in FIG. 20. Although not separately illustrated, the metal gate stacks 244 may include one or more work function layers and one or more metal fill layers. In some implementations, different work function layer stacks may be formed in n-type device regions and p-type device regions. In those implementations, while n-type device regions and p-type device regions may share certain common work function layers, n-type device regions may include one or more work function layers that are not present in the p-type device regions. Similarly, in alternative implementations, p-type device regions may include one or more work function layers that are not present in the n-type device regions. P-type work function layer includes any suitable p-type work function material, such as TiN, TaN, TaSN, Ru, Mo, Al, WN, WCN ZrSi2, MoSi2, TaSi2, NiSi2, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. It is noted that p-type work function layers are not limited to use in p-type device regions and n-type work function layers are not limited to use in n-type device regions. P-type work function layers and n-type work function layers may be applied in n-type device regions and p-type device regions to achieve desired threshold voltage. In some embodiments, the metal gate stack 244 may include one or more metal fill layer. For example, a CVD process or a PVD process deposits the one or more metal fill layer on n-type work function layer(s) and p-type work function layer(s), such that metal fill layer fills any remaining portion of gate trenches 238. The metal fill layer may include a suitable conductive material, such as Al, W, and/or Cu. The metal fill layer may additionally or collectively include other metals, metal oxides, metal nitrides, other suitable materials, or combinations thereof.

Figure 21:
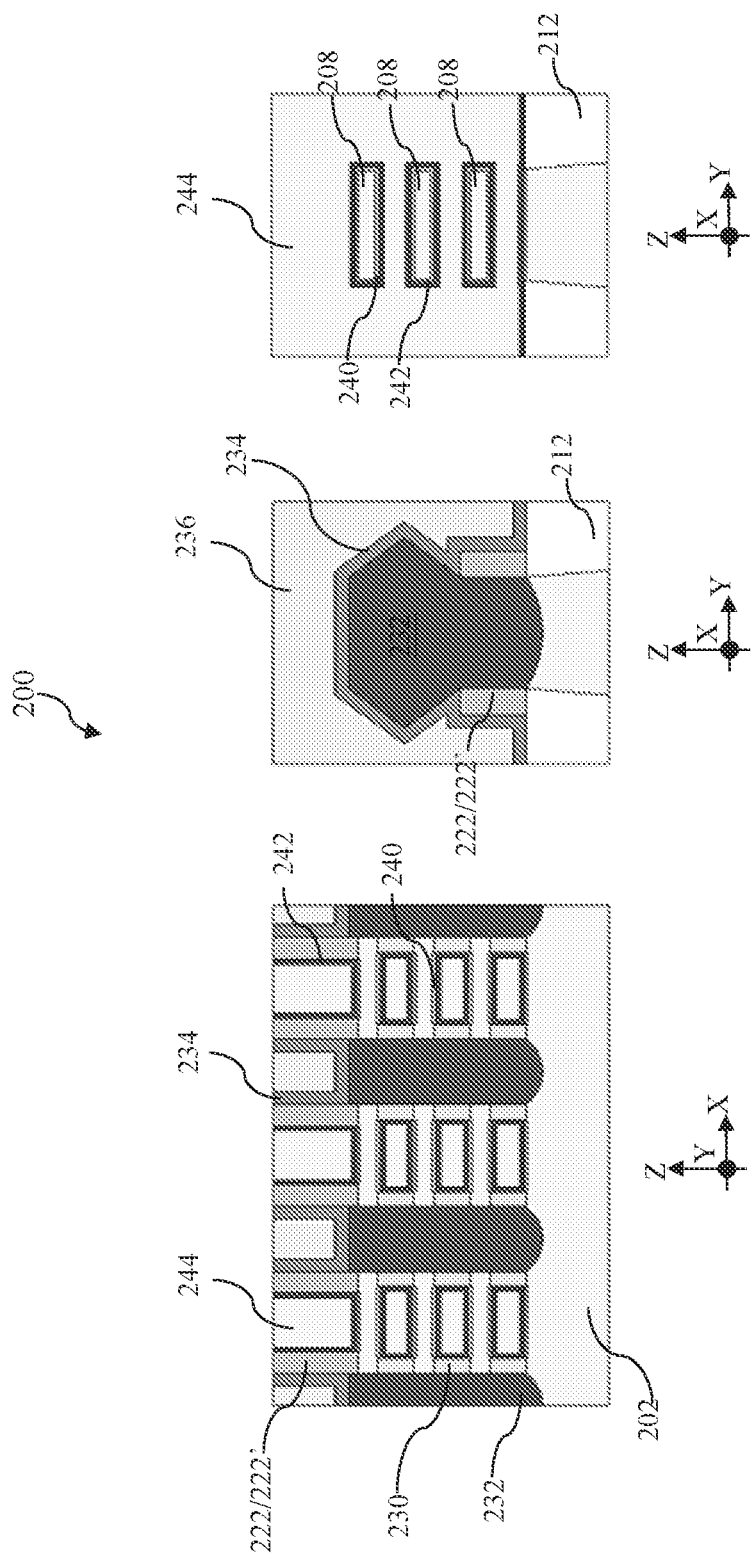

Referring to FIGS. 1C and 21, the method 100 includes a block 130 where the workpiece 200 is planarized to provide a level surface. As the planarization at block 130 is substantially the same throughout the workpiece 200, the planarization in the first area 10 and the second area 20 is collectively illustrated in FIG. 21. In some embodiments, the planarization is performed to remove excess interfacial layer 240, gate dielectric layer 242, and the metal gate stack 244 over the workpiece 200. For example, the planarization may include a CMP process and may be performed until a top surface of ILD layer 236 is substantially planar with a top surface of metal gate stack 244.

Figure 22A:
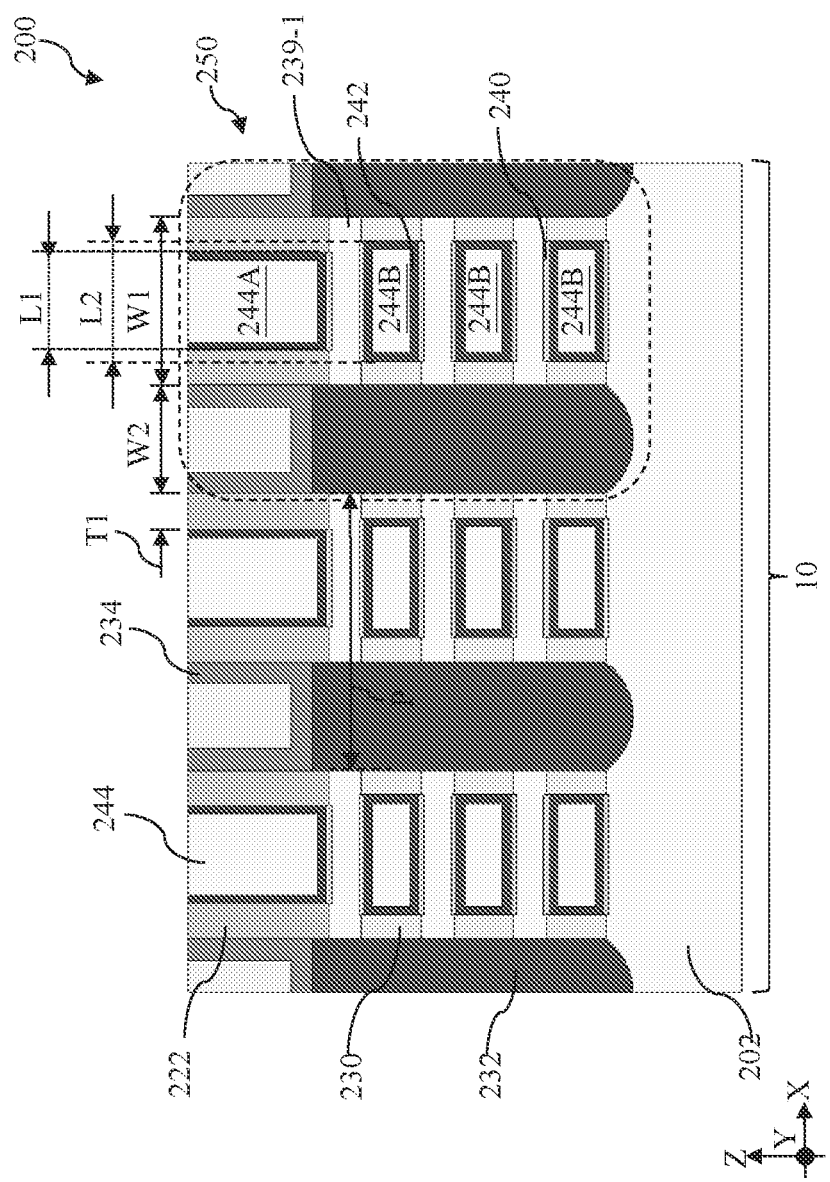
Figure 22B:
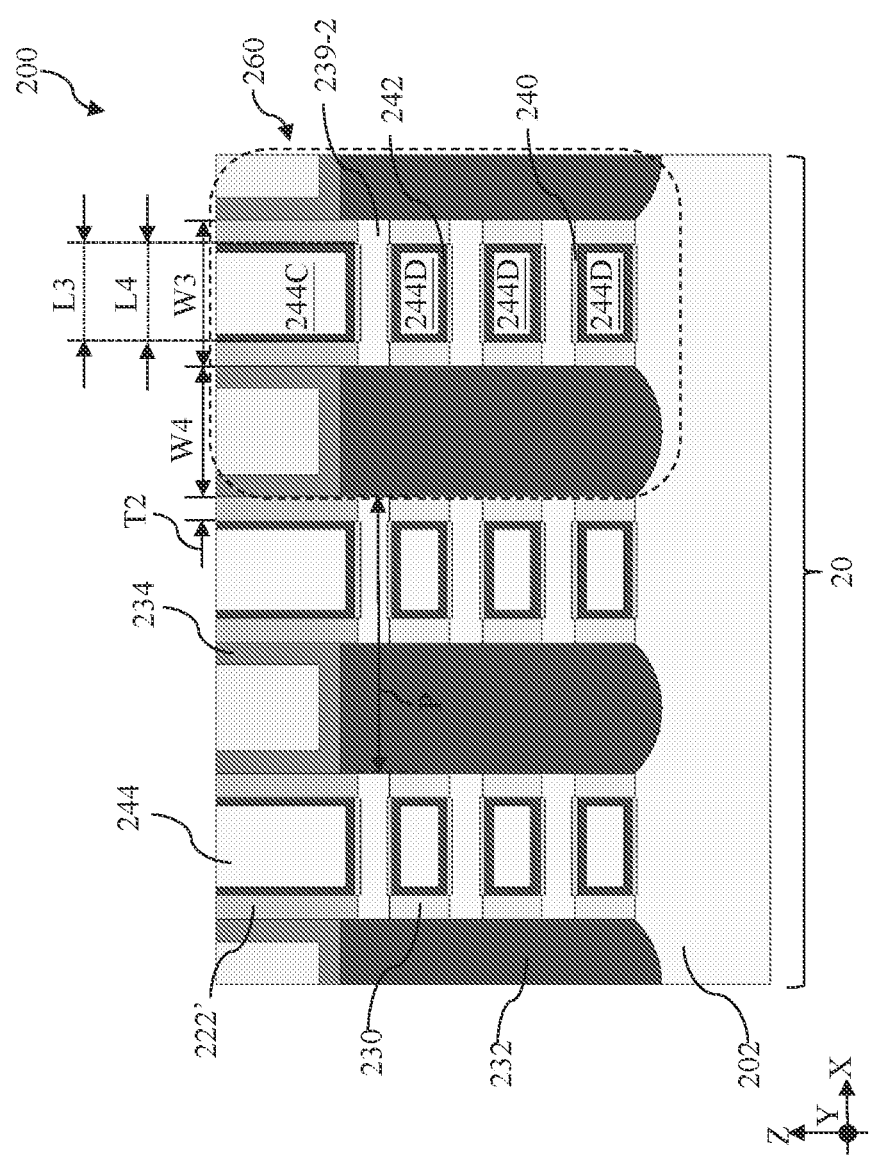

Reference is now made to FIGS. 22A and 22B. Upon conclusion of the operations at block 130, a first GAA transistor 250 shown in FIG. 22A may be formed in the first area 10 of the semiconductor device 200 and a second GAA transistor 260 shown in FIG. 22B may be formed in the second area 20 of the semiconductor device 200. As shown in FIG. 22A, the first gate spacer layer 222 with the larger first thickness T1 result in first channel members 239-1 of a first width W1 along the X direction. Due to the thicker first gate spacer layer 222, each of the metal gate stack 244 in the first area 10 includes a first gate top feature 244A that is disposed on the topmost channel members 239-1 and first lower gate features 244B, each of which is sandwiched/disposed between two adjacent channel members 239. The first gate top feature 244A includes a first gate length L1 and each of the first lower gate feature 244B includes a second gate length L2. The epitaxial source/drain feature 232 in the first area 10 has a second width W2. Because the dummy gate pitch P is uniform across the workpiece 200, P is equal to summation of the first width W1 and the second width W2 in the first area 10. In some embodiments, P is between about 30 nm and about 60 nm; W1 is between about 16 nm and about 46 nm; W2 is between about 9 nm and about 40 nm; L1 is between about 5 nm and about 20 nm; and L2 is between about 6 nm and about 30 nm. As shown in FIG. 22B, the second gate spacer layer 222' with the smaller second thickness T2 result in second channel members 239-2 of a third width W3 along the X direction. Each of the metal gate stack 244 in the second area 20 includes a second gate top feature 244C, which is disposed on the topmost channel members 239-2 and second lower gate features 244D, each of which is sandwiched/disposed between two adjacent channel members 239-2. The second gate top feature 244C includes a third gate length L3 and each of the second lower gate features 244D includes a fourth gate length L4. The epitaxial source/drain feature 232 in the second area 20 has a fourth width W4. Because the dummy gate pitch P is uniform across the workpiece 200, P is equal to summation of the third width W3 and the fourth width W4 in the second area 20. In some embodiments, P is between about 30 nm and about 60 nm; W3 is between about 15 nm and about 45 nm; W4 is between about 10 nm and about 40 nm; L3 is between about 5 nm and about 20 nm; and L4 is between about 5 nm and about 20 nm. In embodiments illustrated in FIG. 22B, the third gate length L3 is substantially identical to the fourth gate length L4.

It can be seen that except for the first gate top feature 244A, the first GAA transistor 250 is characterized by the second gate length L2. The second GAA transistor 260 is characterized by the third gate length L3. In embodiments represented in FIGS. 22A and 22B, the second gate length L2 may be greater than the third gate length L3 by a difference between about 1 nm and about 10 nm. It has been observed that leakage current of a GAA transistor may decrease with the gate length and the threshold voltage of the GAA transistor may increase with the leakage current of the GAA transistor. Because of the second gate length L2 of the first GAA transistor 250 is greater than the third gate length L3 of the second GAA transistor 260, the first GAA transistor 250 has a lower leakage current and a higher threshold voltage than the second GAA transistor 260. In some instances, the first GAA transistor 250 has a first threshold voltage (VT1) and the second GAA transistor 260 has a second threshold voltage (VT2). By implementing both the first GAA transistors 250 in the first area 10 and the second GAA transistors 260 in the second area 20, the semiconductor device 200 according to the present disclosure may include GAA transistors with different threshold voltages—the first threshold voltage (VT1) and the second threshold voltage (VT2).

Referring to FIG. 1C, the method 100 includes a block 132 where further processes are performed. Fabrication can proceed to continue fabrication of the semiconductor device 200. For example, various contacts can be formed to facilitate operation of GAA transistors in the semiconductor device 200. For example, one or more ILD layers, similar to ILD layer 236, and/or CESL layers can be formed over substrate 202 (in particular, over ILD layer 236 and metal gate stacks 244). Contacts can then be formed in ILD layer 236 and/or ILD layers disposed over ILD layer 236. For example, contacts are respectively electrically and/or physically coupled with metal gate stacks 244 and contacts are respectively electrically and/or physically coupled to source/drain regions of the GAA transistors. Because the epitaxial source/drain feature 232 in the first area 10 are narrower (along the X direction, shown in FIGS. 22A and 22B) than those in the second area 20, the source/drain contacts for first GAA transistors 250 in the first area 10 may be narrower than the source/drain contacts for second GAA transistors 260 in the second area 20. Contacts include a conductive material, such as aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. In some embodiments, a metal silicide layer may be formed at the interface between the epitaxial source/drain features 232 and the source/drain contact. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 236 and the contacts (for example, extending through ILD layer 236 and/or the other ILD layers) are a portion of a multilayer interconnect (MLI) structure.

In one exemplary aspect, the present disclosure is directed to a semiconductor device. The semiconductor device includes a first plurality of gate-all-around (GAA) devices in a first device area and a second plurality of GAA devices in a second device area. Each of the first plurality of GAA devices includes a first vertical stack of channel members extending along a first direction, and a first gate structure over and around the first vertical stack of channel members. Each of the second plurality of GAA devices includes a second vertical stack of channel members extending along a second direction, and a second gate structure over and around the second vertical stack of channel members. Each of the first plurality of GAA devices includes a first channel length and each of the second plurality of GAA devices includes a second channel length smaller than the first channel length.

In some embodiments, each of the first gate structure includes a first gate top feature disposed over a topmost channel member of the first vertical stack of channel members, and a plurality of first lower gate features disposed between two adjacent channel members of the first vertical stack of channel members. Each of the second gate structure includes a second gate top feature disposed over a topmost channel member of the second vertical stack of channel members, and a plurality of second lower gate features disposed between two adjacent channel members of the second vertical stack of channel members. The first gate top feature includes a first length along the first direction, the second gate top feature includes a second length along the second direction, and the first length and the second length are substantially identical. In some implementations, each of the plurality of first lower gate features includes a third length along the first direction, each of the plurality of second lower gate features includes a fourth length along the second direction, and the third length is greater than the fourth length. In some embodiments, the fourth length is substantially identical to the first length. In some embodiments, the third length is between about 6 nm and about 30 nm and the fourth length is between about 5 nm and about 20 nm. In some implementations, each of the first plurality of GAA devices further includes a first gate spacer disposed along the first gate top feature and each of the second plurality of GAA devices further includes a second gate spacer disposed along the second gate top feature. In these embodiments, the first gate spacer includes a first thickness and the second gate spacer includes a second thickness smaller than the first thickness. In some instances, a difference between the first thickness and the second thickness is between about 0.5 nm and about 5 nm. In some instances, the first plurality of GAA devices includes a first gate pitch and the second plurality of GAA devices includes a second gate pitch identical to the first gate pitch. In some embodiments, each of the first plurality of GAA devices includes a first source/drain feature, each of the second plurality of GAA devices includes a second source/drain feature, and a thickness of the first source/drain feature along the first direction is smaller than a thickness of the second source/drain feature. In some implementations, each of the first plurality of GAA devices includes a first threshold voltage and each of the second plurality of GAA devices includes a second threshold voltage smaller than the first threshold voltage.

In another exemplary aspect, the present disclosure is directed to a semiconductor device. A semiconductor device includes a first plurality of gate-all-around (GAA) devices in a first device area and a second plurality of GAA devices in a second device area. Each of the first plurality of GAA devices includes a first vertical stack of channel members extending along a first direction, a first gate top feature disposed over a topmost channel member of the first vertical stack of channel members, and a plurality of first lower gate features disposed between two adjacent channel members of the first vertical stack of channel members. Each of the second plurality of GAA devices includes a second vertical stack of channel members extending along a second direction, a second gate top feature disposed over a topmost channel member of the second vertical stack of channel members, and a plurality of second lower gate features disposed between two adjacent channel members of the second vertical stack of channel members. The first gate top feature includes a first length along the first direction, the second gate top feature includes a second length along the second direction, where the first length and the second length are substantially identical. In some implementations, each of the plurality of first lower gate features includes a third length along the first direction and each of the plurality of second lower gate features includes a fourth length along the second direction. The third length is greater than the fourth length.

In some embodiments, the fourth length is substantially identical to the first length. In some implementations, each of the first plurality of GAA devices further includes a first gate spacer disposed along the first gate top feature and each of the second plurality of GAA devices further includes a second gate spacer disposed along the second gate top feature. The first gate spacer includes a first thickness, and the second gate spacer includes a second thickness smaller than the first thickness. In some embodiments. the first plurality of GAA devices include a first gate pitch and the second plurality of GAA devices includes a second gate pitch identical to the first gate pitch. In some implementations, each of the first plurality of GAA devices includes a first source/drain feature, each of the second plurality of GAA devices includes a second source/drain feature, and a thickness of the first source/drain feature along the first direction is smaller than a thickness of the second source/drain feature.

In yet another exemplary aspect, the present disclosure is directed to a method of fabricating a semiconductor device. The method includes forming on a substrate a layer stack including a plurality of first semiconductor layers interleaved by a plurality of second semiconductor layers, forming a first plurality of fin elements from the layer stack in a first area of the substrate, forming a second plurality of fin elements from the layer stack in a second area of the substrate, forming a first plurality of dummy gate stacks over the first plurality of fin elements, forming a second plurality of dummy gate stacks over the second plurality of fin elements, depositing a spacer layer over the first plurality of dummy gate stacks and the second plurality of dummy gate stacks, selectively depositing a polymeric layer over the spacer layer disposed over the first plurality of dummy gate stacks while the spacer layer disposed over the second plurality of dummy gate stacks is not covered by the polymeric layer, and etching the spacer layer over the first plurality of dummy gate stacks and the second plurality of dummy gate stacks.

In some embodiments, the polymeric layer includes carbon and fluorine. In some implementations, the etching of the spacer layer includes forming a first spacer layer over the first plurality of dummy gate stacks and forming a second spacer layer over the second plurality of dummy gate stacks. The first spacer layer includes a first thickness and the second spacer layer includes a second thickness. The first thickness is greater than the second thickness. In some instances, a difference between the first thickness and the second thickness is between 0.5 nm and about 5 nm. In some embodiments, the method may further include forming a first plurality of source/drain trenches in the first area to expose sidewalls of the first plurality of fin elements, forming a second plurality of source/drain trenches in the second area to expose sidewalls of the second plurality of fin elements, and partially etching the plurality of second semiconductor layers in the first plurality of fin elements and the second plurality of fin elements to form inner spacer recesses.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming on a substrate a layer stack comprising a plurality of first semiconductor layers interleaved by a plurality of second semiconductor layers;
    forming a first plurality of fin elements from the layer stack in a first area of the substrate;
    forming a second plurality of fin elements from the layer stack in a second area of the substrate;
    forming a first plurality of dummy gate stacks over channel regions of the first plurality of fin elements;
    forming a second plurality of dummy gate stacks over channel regions of the second plurality of fin elements;
    depositing a spacer layer over the first plurality of dummy gate stacks, the second plurality of dummy gate stacks, top surface of source/drain regions of the first plurality of fin elements, and source/drain regions of the second plurality of fin elements;
    selectively depositing a polymeric layer over the spacer layer disposed over the first plurality of dummy gate stacks while the spacer layer disposed over the second plurality of dummy gate stacks is not covered by the polymeric layer; and
    after the selectively depositing, anisotropically etching the spacer layer, the polymeric layer over the first plurality of dummy gate stacks, the source/drain regions of the first plurality of fin elements, and the source/drain regions of the second plurality of fin elements to form a first plurality of source/drain trenches in the first area and a second plurality of source/drain trenches in the second area,
    wherein the anisotropic etching forms, from the spacer layer, a first spacer layer over sidewalls of the first plurality of dummy gate stacks and a second spacer layer over sidewalls of the second plurality of dummy gate stacks,
    wherein the anisotropic etching etches the polymeric layer and the spacer layer disposed over the second plurality of dummy gate stacks before it starts to etch the spacer layer disposed over the first plurality of dummy gate stacks.

2. The method of claim 1, wherein the polymeric layer comprises carbon and fluorine.

3. The method of claim 1, wherein the plurality of first semiconductor layers comprise silicon (Si) and the plurality of second semiconductor layers comprise silicon germanium (SiGe).

4. The method of claim 1,
    wherein the first spacer layer comprises a first thickness and the second spacer layer comprises a second thickness,
    wherein the first thickness is greater than the second thickness.

5. The method of claim 4, wherein a difference between the first thickness and the second thickness is between 0.5 nm and about 5 nm.

6. The method of claim 4,
    wherein each of the first plurality of source/drain trenches comprises a first spacing, wherein each of the second plurality of source/drain trenches comprises a second spacing greater than the first spacing.

7. The method of claim 1, further comprising:
after the etching of the source/drain regions of the first plurality of fin elements and the source/drain regions of the second plurality of fin elements, partially etching the plurality of second semiconductor layers exposed in the first plurality of source/drain trenches and the second plurality of source/drain trenches to form inner spacer recesses.

8. The method of claim 7, further comprising:
forming inner spacer features in the inner spacer recesses.

9. A method, comprising:
receiving a workpiece comprising:
   a substrate comprising a first area and a second area,
   a first fin-shaped structure over the first area,
   a second fin-shaped structure over the second area,
   a first dummy gate over a channel region of the first fin-shaped structure in the first area,
   a second dummy gate over a channel region of the second fin-shaped structure in the second area, and
   a gate spacer layer disposed over the first dummy gate, the second dummy gate, top surfaces of source/drain regions of the first fin-shaped structures and top surfaces of source/drain regions of the second fin-shaped structures;
selectively depositing a pattern film over the gate spacer layer in the first area; and
after the selectively depositing, anisotropically etching the workpiece to pattern the gate spacer layer to form a first gate spacer along sidewalls of the first dummy gate and a second gate spacer along sidewalls of the second dummy gate,
wherein the anisotropically etching the workpiece etches the source/drain regions of the first fin-shaped structures and the source/drain regions of the second fin-shaped structures to expose the substrate,
wherein the pattern film slows down thinning of the gate spacer layer in the first area but does not stop the thinning of the gate spacer layer in the first area,
wherein a thickness of first gate spacer is greater than a thickness of the second gate spacer.

10. The method of claim 9, wherein the gate spacer layer comprises silicon oxide, silicon oxynitride, silicon nitride, silicon carbonitride, silicon oxycarbide, or silicon oxycarbonitride.

11. The method of claim 9, wherein the anisotropically etching forms a first source/drain trench in the first area and a second source/drain trench in the second area.

12. The method of claim 11,
wherein the first fin-shaped structure and the second fin-shaped structure extend lengthwise along a direction,
wherein the first source/drain trench comprises a first spacing S1,
wherein the second source/drain trench comprises a second spacing S2 greater than the first spacing S1.

13. The method of claim 9, wherein the thickness of the first gate spacer is greater than the thickness of the second gate spacer by between 0.5 nm and about 5 nm.

14. The method of claim 9, wherein each of the first fin-shaped structure and the second fin-shaped structure comprises a plurality of first semiconductor layers interleaved by a plurality of second semiconductor layers.

15. The method of claim 14, wherein the plurality of first semiconductor layers comprise silicon and the plurality of second semiconductor layers comprise silicon germanium.

16. A method, comprising:
receiving a workpiece comprising:
   a substrate comprising a first area and a second area,
   a first fin-shaped structure over the first area and extending lengthwise along a direction,
   a second fin-shaped structure over the second area and extending lengthwise along the direction,
   a first dummy gate over the first fin-shaped structure in the first area,
   a first gate top hard mask layer over the first dummy gate;
   a second dummy gate over the second fin-shaped structure in the second area,
   a second gate top hard mask layer over the second dummy gate, and
   a gate spacer layer disposed over the first dummy gate, the first gate top hard mask layer, the second dummy gate, and the second gate top hard mask layer;
selectively depositing a polymeric layer over the gate spacer layer disposed over the first dummy gate while the gate spacer layer disposed over the second dummy gate is not covered by the polymeric layer; and
after the selectively depositing, anisotropically etching the workpiece to form a first gate spacer along sidewalls of the first dummy gate and the first gate top hard mask layer as well as well as a second gate spacer along sidewalls of the second dummy gate and the second gate top hard mask layer,
wherein the anisotropically etching also forms a first source/drain trench over the first fin-shaped structure and a second source/drain trench over the second fin-shaped structure,
wherein the first source/drain trench comprises a first spacing S1,
wherein the second source/drain trench comprises a second spacing S2 greater than the first spacing S1.

17. The method of claim 16, wherein a thickness of first gate spacer is greater than a thickness of the second gate spacer.

18. The method of claim 17, wherein the thickness of first gate spacer is greater than the thickness of the second gate spacer by between 0.5 nm and about 5 nm.

19. The method of claim 16, further comprising:
forming a first source/drain feature in the first source/drain trench; and
forming a second source/drain feature in the second source/drain trench.

20. The method of claim 19, wherein a width of the first source/drain feature along the direction is smaller than a width of the second source/drain feature along the direction.

* * * * *